US011284534B2

(12) United States Patent
Yamaguchi et al.

(10) Patent No.: US 11,284,534 B2
(45) Date of Patent: Mar. 22, 2022

(54) COOLING DEVICE

(71) Applicant: Sumitomo Precision Products Co., Ltd., Amagasaki (JP)

(72) Inventors: Ryo Yamaguchi, Amagasaki (JP); Kenji Ando, Amagasaki (JP); Keiji Miki, Amagasaki (JP)

(73) Assignee: Sumitomo Precision Products Co., Ltd., Amagasaki (JP)

( * ) Notice: Subject to any disclaimer, the term of this patent is extended or adjusted under 35 U.S.C. 154(b) by 0 days.

(21) Appl. No.: 16/332,307

(22) PCT Filed: Aug. 1, 2017

(86) PCT No.: PCT/JP2017/027934
§ 371 (c)(1),
(2) Date: Mar. 11, 2019

(87) PCT Pub. No.: WO2018/055923
PCT Pub. Date: Mar. 29, 2018

(65) Prior Publication Data
US 2019/0239389 A1    Aug. 1, 2019

(30) Foreign Application Priority Data
Sep. 23, 2016 (JP) .............................. JP2016-185273

(51) Int. Cl.
*H05K 7/20* (2006.01)
*F28F 13/12* (2006.01)
*F28F 13/08* (2006.01)
*H01L 23/473* (2006.01)
*F28F 13/06* (2006.01)
*F28F 3/12* (2006.01)
*F28F 3/14* (2006.01)

(52) U.S. Cl.
CPC ......... *H05K 7/20272* (2013.01); *F28F 13/06* (2013.01); *F28F 13/08* (2013.01); *F28F 13/12* (2013.01); *H01L 23/473* (2013.01); *H05K 7/20* (2013.01); *H05K 7/20254* (2013.01); *F28F 3/12* (2013.01); *F28F 3/14* (2013.01)

(58) Field of Classification Search
CPC ........ F28F 3/02; F28F 3/12; F28F 3/14; F28F 13/06; F28F 13/12; F28F 13/08; H01L 23/473; H05K 7/20254; H05K 7/20272
See application file for complete search history.

(56) References Cited

U.S. PATENT DOCUMENTS 4,103,737 A * 8/1978 Perkins ................. H01L 23/467
165/109.1
5,801,442 A * 9/1998 Hamilton .............. H01L 23/473
257/712
5,978,220 A * 11/1999 Frey ...................... H01L 23/473
361/699
6,009,937 A * 1/2000 Gonner ..................... F28F 3/02
165/185
6,118,656 A * 9/2000 Wang ........................ F28F 3/02
257/E23.103
6,169,658 B1 * 1/2001 Arena ....................... F28F 3/02
165/104.33
7,781,258 B2 * 8/2010 Toba ..................... H01L 23/373
438/107
8,081,465 B2 * 12/2011 Nishiura ............. H01L 23/3735
165/147
9,190,344 B2 * 11/2015 Mori .................... H01L 23/473
9,245,821 B2 * 1/2016 Gohara ............... H01L 23/3735
10,044,078 B2 * 8/2018 Jung .................... H01M 10/6551
2002/0101718 A1 * 8/2002 Negishi ................... F28F 3/025
361/699
2003/0154724 A1 * 8/2003 Urch ...................... F28D 9/0025
62/3.2
2003/0155106 A1 * 8/2003 Malone .................. F28F 13/06
165/121
2004/0206477 A1 * 10/2004 Kenny .................... F28F 3/086
165/80.4
2005/0072563 A1 * 4/2005 Wang .................... H01L 23/427
165/185
2006/0225867 A1 * 10/2006 Park ...................... F28F 9/0263
165/80.4
2007/0084585 A1 * 4/2007 Takagi .................. F28D 9/0043
165/80.4

(Continued)

FOREIGN PATENT DOCUMENTS

CN    102549743 A    7/2012
EP    1 343 204 A1   9/2003
(Continued)

OTHER PUBLICATIONS

JP H09283679 A English Machine Translation (Year: 1997).*
English translation of document B2 (WO 00/16397 A1 previously filed on Mar. 11, 2019) seven pages.
International Search Report (PCT/ISA/210) issued in PCT Application No. PCT/JP2017/027934 dated Oct. 31, 2017 with English translation (five pages).
German-language Written Opinion (PCT/ISA/237) issued in PCT Application No. PCT/JP2017/027934 dated Oct. 31, 2017 (six pages).

*Primary Examiner* — Len Tran
*Assistant Examiner* — Jenna M Hopkins
(74) *Attorney, Agent, or Firm* — Crowell & Moring LLP

(57) ABSTRACT

A cooling device includes a main body unit that has, on a surface thereof, a plurality of disposition regions where objects to be cooled are disposed, and a refrigerant flow passage provided in the main body unit. The refrigerant flow passage includes a first flow passage portion and a second flow passage portion. The first flow passage portion is formed at a predetermined position of overlapping a part of an inside of a predetermined disposition region to allow a refrigerant to pass therethrough more intensively than the second flow passage portion.

10 Claims, 12 Drawing Sheets

(56) References Cited

U.S. PATENT DOCUMENTS

| | | | | |
|---|---|---|---|---|
| 2007/0227697 A1* | 10/2007 | Takahashi | ............ | H01L 23/473 165/80.4 |
| 2008/0029260 A1* | 2/2008 | Hu | ............ | F28F 3/12 165/182 |
| 2008/0089029 A1* | 4/2008 | Launay | ............ | G06F 1/206 361/697 |
| 2008/0169088 A1* | 7/2008 | Aoki | ............ | F28F 3/048 165/104.19 |
| 2008/0239671 A1* | 10/2008 | Amano | ............ | H01L 23/3735 361/699 |
| 2009/0250195 A1* | 10/2009 | Yoshida | ............ | F28F 3/02 165/80.3 |
| 2010/0051235 A1* | 3/2010 | Mori | ............ | H01L 21/4882 165/104.19 |
| 2010/0139631 A1* | 6/2010 | Geskes | ............ | F28F 3/042 123/568.12 |
| 2010/0172091 A1* | 7/2010 | Nishiura | ............ | H01L 23/473 361/689 |
| 2010/0315780 A1* | 12/2010 | Murakami | ............ | H05K 7/20927 361/699 |
| 2011/0030217 A1* | 2/2011 | Morino | ............ | H01L 21/4878 29/890.03 |
| 2012/0139096 A1* | 6/2012 | Gohara | ............ | H01L 23/473 257/706 |
| 2012/0140420 A1* | 6/2012 | Soyano | ............ | H01L 23/3736 361/715 |
| 2012/0234021 A1* | 9/2012 | Okuda | ............ | F28F 3/12 62/3.2 |
| 2013/0058041 A1* | 3/2013 | Gohara | ............ | H01L 23/3735 361/699 |
| 2013/0112373 A1* | 5/2013 | Fukai | ............ | F28D 15/0266 165/104.21 |
| 2013/0112388 A1* | 5/2013 | Kwak | ............ | H01L 23/473 165/185 |
| 2013/0206375 A1* | 8/2013 | Yoshida | ............ | H01L 23/473 165/170 |
| 2014/0046248 A1* | 2/2014 | Fini | ............ | A61M 1/166 604/29 |
| 2014/0069615 A1* | 3/2014 | Kusaka | ............ | H01L 23/473 165/104.19 |
| 2014/0138075 A1* | 5/2014 | Yang | ............ | H01L 23/473 165/185 |
| 2014/0239486 A1* | 8/2014 | Gohara | ............ | F28F 9/026 257/714 |
| 2014/0305619 A1* | 10/2014 | Wright | ............ | F28F 21/04 165/166 |
| 2016/0036104 A1* | 2/2016 | Kenney | ............ | F28F 3/044 429/120 |
| 2016/0129792 A1* | 5/2016 | Gohara | ............ | B23P 15/26 310/54 |
| 2016/0183409 A1* | 6/2016 | Zhou | ............ | H01L 23/4735 361/699 |
| 2016/0190038 A1* | 6/2016 | Koyama | ............ | H01L 23/3675 257/693 |
| 2016/0293518 A1* | 10/2016 | Gohara | ............ | H01L 21/4871 |
| 2016/0343640 A1* | 11/2016 | Gohara | ............ | H05K 7/20927 |
| 2017/0363375 A1* | 12/2017 | Mayor | ............ | F28F 9/22 |

FOREIGN PATENT DOCUMENTS

| | | |
|---|---|---|
| JP | 9-283679 A | 10/1997 |
| JP | 2007-208116 A | 8/2007 |
| JP | 2008-544207 A | 12/2008 |
| JP | 2010-40757 A | 2/2010 |
| JP | 4410065 B2 | 2/2010 |
| JP | 2012-533868 A | 12/2012 |
| JP | 2013-197159 A | 9/2013 |
| WO | WO 00/16397 A1 | 3/2000 |
| WO | WO 02/49106 A1 | 6/2002 |
| WO | WO-0249106 A1 * | 6/2002 ......... H05K 7/20727 |
| WO | WO 2011/145640 A1 | 11/2011 |
| WO | WO-2015115028 A1 * | 8/2015 ............... F28F 3/02 |

\* cited by examiner (MODIFICATION EXAMPLE)

COOLING DEVICE

TECHNICAL FIELD

The present invention relates to a cooling device, and particularly relates to a cooling device that cools an object to be cooled which is disposed on a surface thereof by a refrigerant flowing in a refrigerant flow passage therein.

BACKGROUND ART

A cooling device that cools an object to be cooled which is disposed on a surface thereof by a refrigerant flowing in a refrigerant flow passage therein is known in the related art. Such a cooling device is disclosed, for example, in Japanese Patent No. 4410065.

A water-cooled cold plate (a cooling device) that includes a plate main body forming a refrigerant flow passage and cools electronic components, which are a plurality of objects to be cooled disposed on a plate main body surface along the refrigerant flow passage, by a refrigerant flowing in the refrigerant flow passage is disclosed in Japanese Patent No. 4410065. The cold plate disclosed in Japanese Patent No. 4410065 is configured such that a length along the refrigerant flow passage of an offset fin (a heat transferring fin) disposed inside the refrigerant flow passage becomes shorter toward a downstream side. In a case where the plurality of electronic components are disposed along the refrigerant flow passage, a refrigerant temperature increases from an upstream side to the downstream side of the refrigerant flow passage due to heat absorption, and thus each of the electronic components cannot be evenly cooled. Since a length of the offset fin becomes short toward the downstream side step by step in Japanese Patent No. 4410065, a heat exchange amount is increased by increasing refrigerant circulation resistance step by step, and thus each of the electronic components over the entire flow passage can be evenly cooled.

CITATION LIST

Patent Literature

[PTL 1] Japanese Patent No. 4410065

SUMMARY OF INVENTION

Technical Problem

As a result of a thorough study by the present inventors, a case where a cooling capacity in each of the individual objects to be cooled is locally insufficient (the objects to be cooled exceed a locally allowable temperature (a use limit temperature of the objects to be cooled)) when internal heat generation of the objects to be cooled is not uniform and has a distribution is found in the cold plate of the related art. The present inventors have found a case where a cooling capacity is insufficient with respect to the objects to be cooled that are disposed not only on the downstream side of the refrigerant flow passage but also at positions in the middle of the refrigerant flow passage in consideration of a case where total heat generation amounts of the individual objects to be cooled are different due to a difference in the type of each of the objects to be cooled. In addition, in a case of simply improving a cooling capacity of the entire flow passage, a pressure loss increases and exceeds an allowable load on a refrigerant supply side (a capacity of a pump for refrigerant supply). Therefore, it is also necessary to make sure that the pressure loss of the entire cooling device does not increase. If a pump with a great capacity is used in order to make sure that the allowable load on the refrigerant supply side is not exceeded, costs increase by the increased capacity.

Based on the perspective, the present inventors have reached a conclusion that it is difficult to suppress an increase in the pressure loss of the entire cooling device and to suppress local insufficiency of a cooling capacity so as to secure a sufficient cooling capacity with respect to the objects to be cooled, simply by making the length of the offset fin short toward the downstream side of the refrigerant flow passage step by step as in the cold plate disclosed in Japanese Patent No. 4410065.

The invention is devised in order to solve the problems described above, and an object of the invention is to provide a cooling device that can suppress an increase in a pressure loss of the entire cooling device and suppress local insufficiency of a cooling capacity so as to secure a sufficient cooling capacity with respect to an object to be cooled.

Solution to Problem

According to a first aspect of the invention, in order to achieve the object, there is provided a cooling device including a main body unit that has, on a surface thereof, a plurality of disposition regions where an object to be cooled is disposed and a refrigerant flow passage provided in the main body unit. The refrigerant flow passage includes a first flow passage portion that passes a position of overlapping a predetermined disposition region out of the plurality of disposition regions and a second flow passage portion that passes a position of overlapping the other disposition regions other than the predetermined disposition region. The first flow passage portion is formed at a predetermined position of overlapping a part of an inside of the predetermined disposition region to allow a refrigerant to pass therethrough more intensively than the second flow passage portion.

As described above, in the cooling device according to the first aspect of the invention, the refrigerant flow passage including the first flow passage portion that passes the position of overlapping the predetermined disposition region, out of the plurality of disposition regions, and the second flow passage portion that passes the position of overlapping the other disposition regions other than the predetermined disposition region is provided, and the first flow passage portion is formed at the predetermined position of overlapping a part of the inside of the predetermined disposition region to allow a refrigerant to pass therethrough more intensively than the second flow passage portion. Accordingly, the flow rate of the refrigerant can be increased by causing the refrigerant to intensively flow at the predetermined position in the first flow passage portion, and thus a cooling capacity with respect to a part, which has the position of overlapping the predetermined position, can be locally improved. Therefore, it is possible to suppress local insufficiency of the cooling capacity (the temperature of the object to be cooled locally exceeds an allowable temperature) by disposing the object to be cooled such that a portion that particularly requires cooling has a position of overlapping the first flow passage portion (the predetermined position) in consideration of a heat generation distribution inside the object to be cooled. When the first flow passage portion is disposed in accordance with the predetermined disposition region that requires a cooling capacity most, out of the plurality of disposition regions where respective objects to be cooled are disposed, insufficiency of the cooling capacity in the portion that requires cooling most can be suppressed. Thus, it is possible to secure a sufficient cooling capacity for the entire refrigerant flow passage with respect to each object to be cooled. By providing the second flow passage portion that can suppress a pressure loss to be small instead of allowing a refrigerant to flow therethrough as intensively as the first flow passage portion at the position of overlapping the other disposition regions where there is an allowance in a cooling capacity, an increase in a pressure loss caused by the first flow passage portion can be canceled out, and thus an increase in a pressure loss in the entire cooling device can be suppressed. As a result, an increase in a pressure loss of the entire the cooling device can be suppressed and local insufficiency of a cooling capacity can be suppressed so as to secure a sufficient cooling capacity with respect to the object to be cooled.

In the first aspect of the invention, it is preferable that the first flow passage portion be disposed at the predetermined position of overlapping a local heat generating unit of the object to be cooled disposed in the predetermined disposition region. According to such a configuration, since the first flow passage portion can be disposed at the position of overlapping the local heat generating unit having a particularly high heat generation density, out of the objects to be cooled, insufficiency of a cooling capacity caused by local heat generation of the object to be cooled can be reliably and effectively suppressed.

In this case, it is preferable that the first flow passage portion be configured to allow the refrigerant to intensively pass the predetermined position by having a first flow passage width smaller than a second flow passage width of the second flow passage portion. According to such a configuration, since the flow passage width of the first flow passage portion is narrowed so as to become the first flow passage width that is smaller than the second flow passage width, the flow rate of the refrigerant can be easily increased by concentrating the refrigerant at the predetermined position, and thus a local cooling capacity can be increased. In addition, since the second flow passage width of the second flow passage portion can be made relatively large, a pressure loss of the second flow passage portion can be suppressed to be small, and thus an increase in a pressure loss of the entire cooling device can be suppressed.

In a configuration where the first flow passage portion has the first flow passage width, it is preferable that the first flow passage width of the first flow passage portion be a size that is equal to or larger than a width of the local heat generating unit in a flow passage width direction. According to such a configuration, even in a case where the first flow passage width is made smaller than the second flow passage width, the first flow passage portion (the predetermined position) can be formed at least in a range of overlapping the entire local heat generating unit. As a result, the local heat generating unit can be effectively cooled by raising the flow rate of the refrigerant in the first flow passage portion (the predetermined position) and cooling the entire local heat generating unit.

In a configuration where the first flow passage portion has the first flow passage width, it is preferable that plate-shaped heat transferring fins be provided in the refrigerant flow passage, and the heat transferring fin in the second flow passage portion be configured with a fin having a smaller pressure loss than the heat transferring fin in the first flow passage portion. According to such a configuration, a pressure loss in the second flow passage portion where there is an allowance in a cooling capacity can be suppressed to be small not only by making the second flow passage width of the second flow passage portion relatively large but also by providing the heat transferring fin having a pressure loss smaller than the heat transferring fin in the first flow passage portion into the second flow passage portion. As a result, an increase in a pressure loss in the entire cooling device can be suppressed.

In this case, it is preferable that the heat transferring fin in the second flow passage portion be a linear fin extending in a refrigerant circulation direction, and the heat transferring fin in the first flow passage portion be an offset fin that is formed such that a plurality of fin portions arranged in the refrigerant circulation direction are shifted away from each other in a flow passage width direction. According to such a configuration, since the linear fin having a low heat transferring capacity with a small pressure loss is provided in the second flow passage portion that relatively has an allowance in a cooling capacity and the offset fin having a high heat transferring capacity with a great pressure loss is provided in the first flow passage portion that relatively requires a cooling capacity, a cooling capacity with respect to each of the plurality of objects to be cooled can be optimized in response to each heat generation while suppressing an increase in a pressure loss of the entire cooling device. In addition, for example, when a refrigerant having a temperature difference flows in the first flow passage portion 121, such as when a refrigerant, which has passed the position of overlapping the local heat generating unit and has been warmed on the upstream side of the first flow passage portion, and a low-temperature refrigerant, which has passed a place where there is not much heat generation (which has passed a position of overlapping a portion other than the local heat generating unit), flow into the first flow passage portion, the offset fin stirs the refrigerant, a refrigerant temperature averages, and thereby a cooling capacity can be maintained. Therefore, the local heat generating unit can be effectively cooled.

In a case where the heat transferring fin in the second flow passage portion is configured with a fin having a pressure loss smaller than the heat transferring fin in the first flow passage portion, it is preferable that the second flow passage portion be disposed upstream of the first flow passage portion in the refrigerant flow passage, and the plurality of heat transferring fins having different fin shapes or different pitches in a flow passage width direction be provided in the second flow passage portion such that the closer to the upstream side, the smaller a pressure loss. Herein, the closer to the downstream side in the second flow passage portion, the more a refrigerant temperature increases and an allowance for a cooling capacity decreases. By providing the heat transferring fin that has a smaller pressure loss and a lower heat transferring capacity as it goes closer to the upstream side on which there is an allowance in a cooling capacity, the pressure loss and the heat transferring capacity can be adjusted according to an allowance for a cooling capacity. Therefore, the cooling capacity can be secured and an increase in the pressure loss of the cooling device can be suppressed more effectively.

In a configuration where the first flow passage portion is disposed at the predetermined position of overlapping the local heat generating unit of the object to be cooled, it is preferable that the predetermined disposition region be the disposition region positioned on a most downstream side of the refrigerant flow passage, out of the plurality of disposition regions. Herein, in a case where there is no great difference in a heat generation amount of each object to be cooled disposed in each of the plurality of disposition regions, a cooling capacity is likely to become insufficient for the object to be cooled disposed in the disposition region on the most downstream side. For this reason, insufficiency of a cooling capacity caused by local heat generation of the object to be cooled can be more effectively suppressed by setting the disposition region positioned on the most downstream side of the refrigerant flow passage as the predetermined disposition region and disposing the first flow passage portion at the predetermined position of overlapping the local heat generating unit of the object to be cooled disposed in the predetermined disposition region.

In a configuration where the first flow passage portion is disposed at the predetermined position of overlapping the local heat generating unit of the object to be cooled, it is preferable that the predetermined disposition region be the disposition region where the object to be cooled including the local heat generating unit having a highest heat generation density is disposed, out of the plurality of disposition regions. Herein, in a case where heat generation amounts of the objects to be cooled disposed in the plurality of disposition regions are different from each other, a cooling capacity is likely to become insufficient for the local heat generating unit having the highest heat generation density. For this reason, insufficiency of a cooling capacity caused by local heat generation of the object to be cooled can be more effectively suppressed by setting the disposition region where the object to be cooled including the local heat generating unit having the highest heat generation density is disposed as the predetermined disposition region and disposing the first flow passage portion at the predetermined position of overlapping the local heat generating unit of the object to be cooled disposed in the predetermined disposition region.

According to a second aspect of the invention, there is provided a cooling device including a main body unit that has, on a surface thereof, a plurality of disposition regions where an object to be cooled is disposed and a refrigerant flow passage provided in the main body unit. A first heat transferring fin disposed at a position of overlapping a predetermined disposition region, out of the plurality of disposition regions, and a second heat transferring fin disposed at a position of overlapping the other disposition regions other than the predetermined disposition region are provided in the refrigerant flow passage. The second heat transferring fin is formed with a linear fin, and the first heat transferring fin is formed with an offset fin that has a greater pressure loss and a higher heat transferring capacity than the second heat transferring fin.

As described above, in the cooling device according to the second aspect of the invention, the first heat transferring fin disposed at the position of overlapping the predetermined disposition region, out of the plurality of disposition regions, and the second heat transferring fin disposed at the position of overlapping the other disposition regions other than the predetermined disposition region are provided inside the refrigerant flow passage. The second heat transferring fin is configured with the linear fin, and the first heat transferring fin is configured with the offset fin that has a greater pressure loss and a higher heat transferring capacity than the second heat transferring fin. Accordingly, in addition to having a higher heat transferring capacity than the second heat transferring fin, the first heat transferring fin can stir a refrigerant by means of the offset fin. Therefore, by disposing the object to be cooled such that a portion that particularly requires cooling is at the position of overlapping the first heat transferring fin in consideration of a heat generation distribution inside the object to be cooled, a refrigerant warmed at a local heat generation place and a low-temperature refrigerant at a place where there is not much heat generation are stirred by the first heat transferring fin, a refrigerant temperature averages, and thereby a cooling capacity can be maintained. As a result, it is possible to suppress insufficiency of a cooling capacity (the temperature of the object to be cooled exceeding the locally allowable temperature), which is caused by local heat generation. If the first heat transferring fin is disposed in accordance with the predetermined disposition region that requires a cooling capacity most, out of the plurality of disposition regions where the respective objects to be cooled are disposed, it is possible to secure a sufficient cooling capacity for the entire refrigerant flow passage with respect to each of the objects to be cooled. By providing the second heat transferring fin that is formed with the linear fin, which has a smaller pressure loss than the first heat transferring fin, in the other disposition regions where there is an allowance in a cooling capacity, an increase in a pressure loss caused by the first heat transferring fin can be canceled out, and thus an increase in a pressure loss in the entire cooling device can be suppressed. As a result, an increase in a pressure loss of the entire the cooling device can be suppressed and local insufficiency of a cooling capacity can be suppressed so as to secure a sufficient cooling capacity with respect to the object to be cooled.

Advantageous Effects of Invention

An increase in a pressure loss of the entire the cooling device can be suppressed and local insufficiency of a cooling capacity can be suppressed so as to secure a sufficient cooling capacity with respect to the object to be cooled.

DESCRIPTION OF EMBODIMENTS

Hereinafter, embodiments of the present invention will be described based on the drawings.

First Embodiment

Next, a configuration of a cooling device 100 according to a first embodiment will be described with reference to FIGS. 1 to 8. The cooling device 100 is a water-cooled cold plate that absorbs and cools heat from an object to be cooled mounted on an upper surface (a mounting surface). Although not particularly limited, an object to be cooled M is a heat generating body, for example, a variety of electronic devices and electronic circuits, and the like. The cooling device 100 can be particularly suitably used, for example, in a case of cooling an object to be cooled with a great heat generation amount, such as a power module used in a power conversion device. Hereinafter, an example, in which the object to be cooled M is a power module including a switching element for power control, such as an insulated-gate bipolar transistor (IGBT), will be described.

Figure 1:
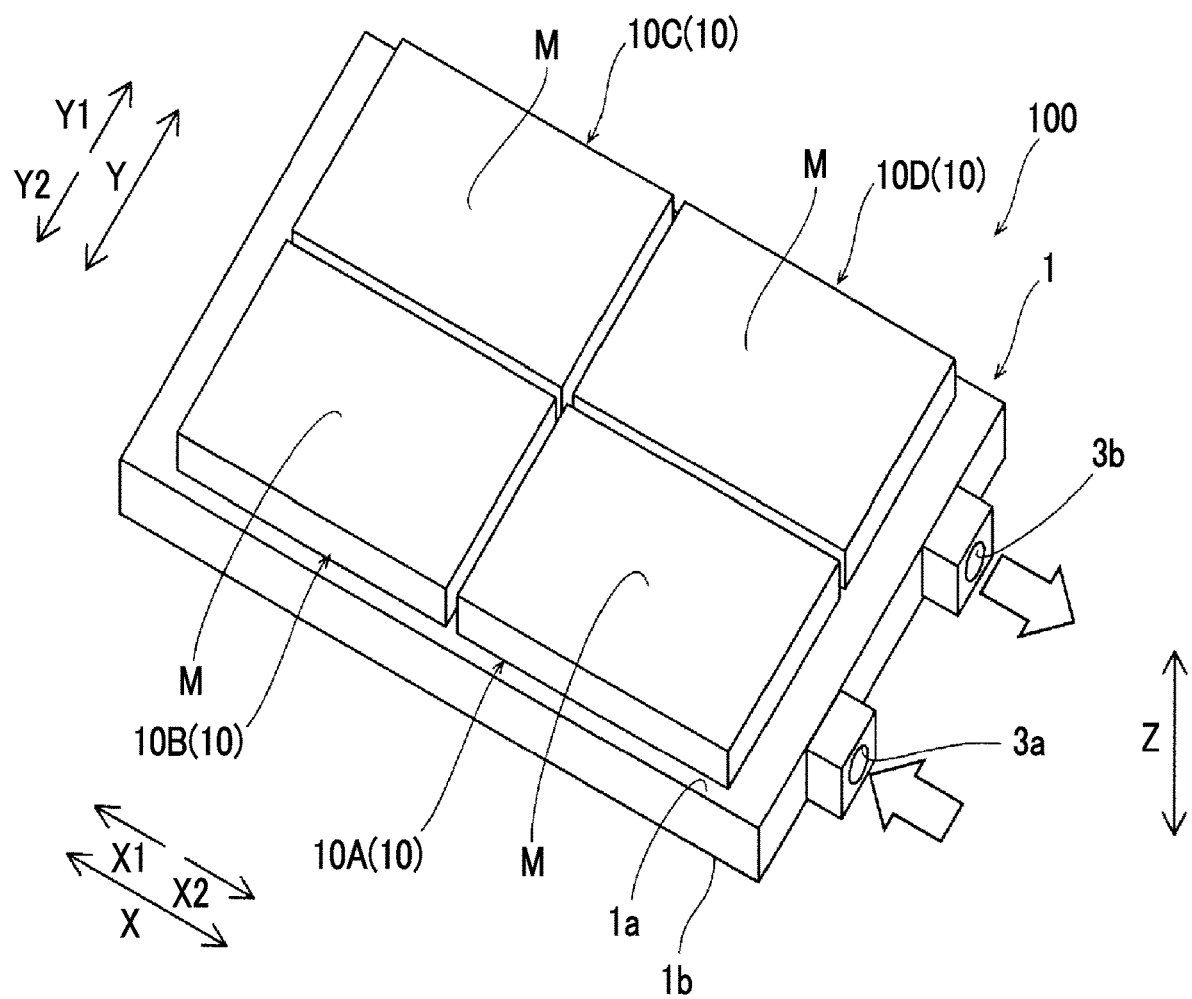
FIG. 1 is a schematic perspective view illustrating a state where an object to be cooled is disposed on a cooling device according to a first embodiment of the present invention.
Figure 2:
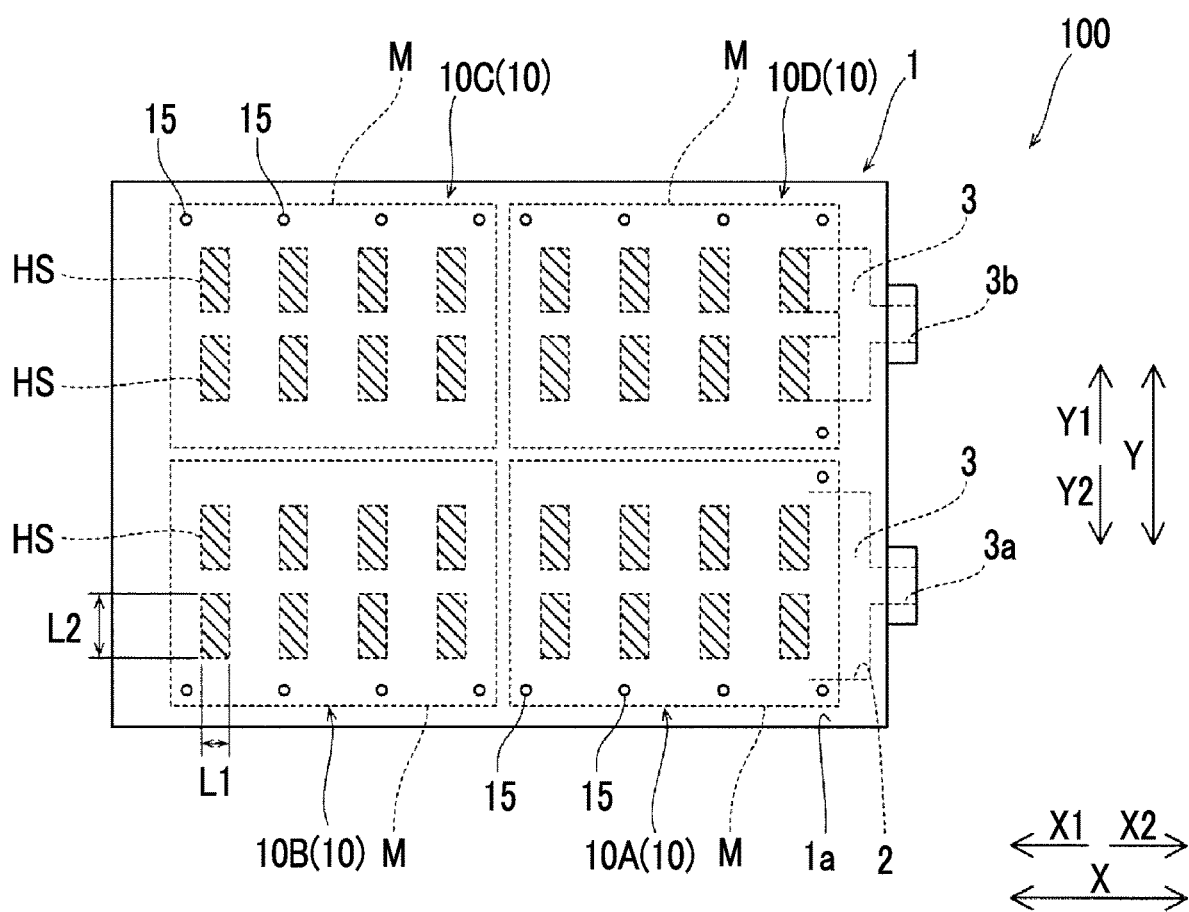
FIG. 2 is a top view of the cooling device, which illustrates a disposition region of the object to be cooled.

As illustrated in FIGS. 1 and 2, the cooling device 100 includes a main body unit 1. The main body unit 1 has, on a surface thereof, a plurality of disposition regions 10 where the objects to be cooled M are disposed and has a refrigerant flow passage 2 (refer to FIG. 2) inside therein.

The main body unit 1 has a substantially rectangular flat plate shape. The main body unit 1 has a first surface (upper surface) 1a and a second surface (lower surface) 1b, both of which have a flat surface shape. Two header units 3, which serve as an inlet and an outlet of a refrigerant with respect to the refrigerant flow passage 2, are provided at a side surface of one end portion of the main body unit 1 in a longitudinal direction. A refrigerant inlet 3a and a refrigerant outlet 3b, which are respectively formed with openings, are provided in the two header units 3. The refrigerant inlet 3a and the refrigerant outlet 3b communicate with one end and the other end of the refrigerant flow passage 2, respectively. Hereinafter, for convenience of description, out of two directions orthogonal to each other in plan view (top view), the longitudinal direction of the main body unit 1 will be referred to as an X-direction, and a lateral direction of the main body unit 1 will be referred to as a Y-direction. A thickness direction (a vertical direction) of the main body unit 1 will be referred to as a Z-direction.

The plurality of disposition regions 10 for disposing the objects to be cooled M are formed on the first surface 1a of the main body unit 1. The disposition regions 10 are regions, in which the objects to be cooled M are placed and lower surfaces of the objects to be cooled M come into contact with the first surface 1a, within the first surface 1a. The four disposition regions 10 (hereinafter, referred to as disposition regions 10A to 10D) are provided on the main body unit 1, and in total four objects to be cooled M can be disposed on the cooling device 100.

Screw holes 15 (refer to FIG. 2) corresponding to the respective disposition regions 10 are provided in the main body unit 1, and thus the objects to be cooled M can be positioned and fixed in the disposition regions 10. In a state where a gap is removed by a thermally conductive compound, thermal grease, and the like, the objects to be cooled M are disposed (mounted) to come into close contact with the disposition regions 10 on the first surface 1a.

The object to be cooled M has a rectangular plate shape in plan view. Each of the disposition regions 10 is formed such that a long side of the object to be cooled M is placed so as to match the X-direction and a short side is placed so as to match the Y-direction. The object to be cooled M does not uniformly generate heat, and includes local heat generating units (heat spots) HS. In a case where the object to be cooled M is a power module, one or a plurality of switching elements disposed inside the object to be cooled M are heat generation sources. Therefore, the object to be cooled M includes the local heat generating units HS corresponding to positions at which the individual switching elements are disposed. In a case of FIG. 2, since four local heat generating units HS are linearly arranged in a long-side direction (the X-direction) to form a row and there are two of these rows in a short-side direction (the Y-direction), there are in total eight local heat generating units HS in the object to be cooled M. The local heat generating unit HS has a length L1 in the X-direction and a length L2 in the Y-direction.

The local heat generating units HS are regions having a heat generation density higher than other portions of the entire object to be cooled M. For this reason, even when the lower surface of the object to be cooled M is evenly cooled at a sufficient heat radiation amount with respect to a total heat generation amount of the object to be cooled M, an allowable temperature is exceeded in some cases in the local heat generating units HS having a high heat generation density.

Figure 3:
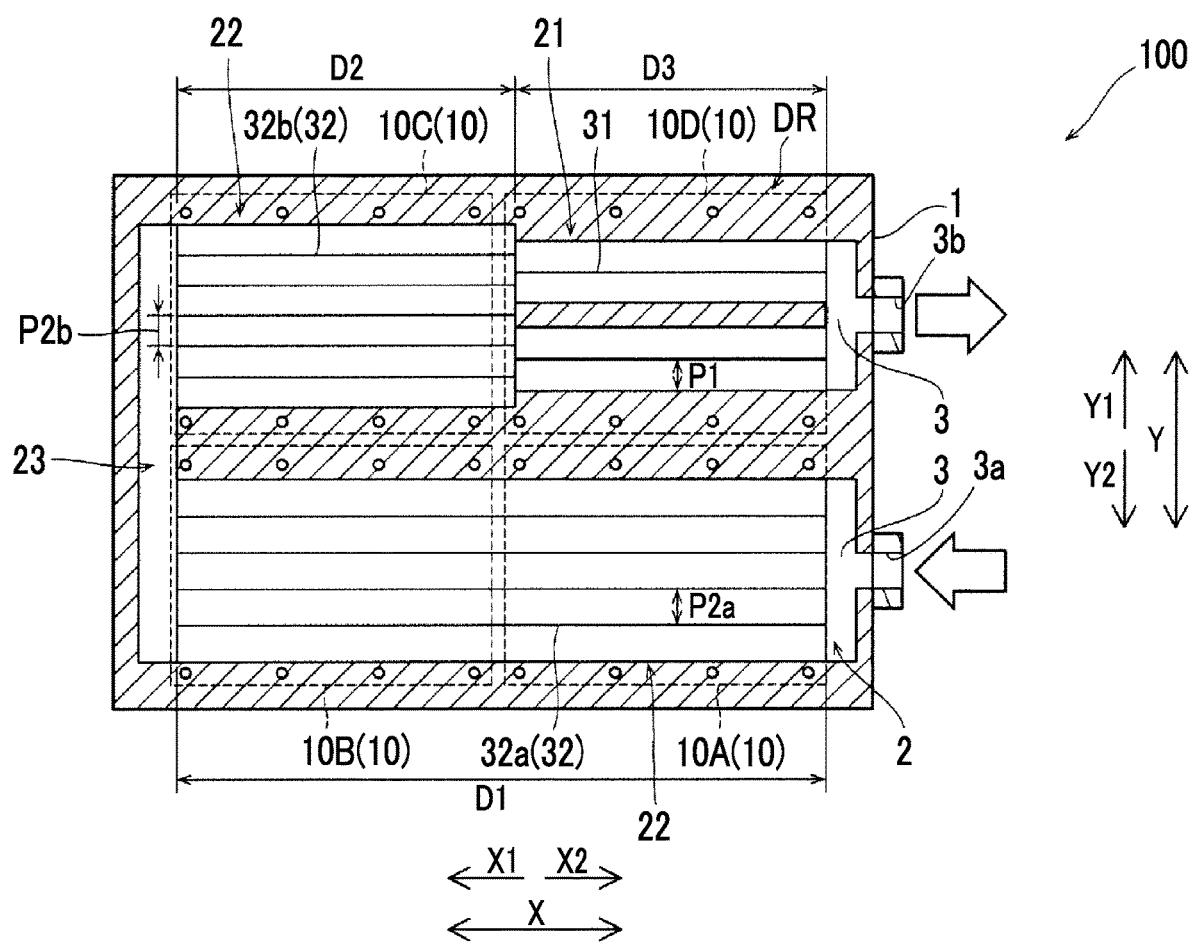
FIG. 3 is a horizontal sectional view schematically illustrating a refrigerant flow passage of the cooling device.

The refrigerant flow passage 2 is a space for refrigerant circulation that is formed inside the main body unit 1. FIG. 3 illustrates an example in which a configuration where the refrigerant flow passage 2 has a turnback portion 23, and a refrigerant flowed in from the refrigerant inlet 3a on one end side in the X-direction turns back on the other end side and is discharged from the refrigerant outlet 3b on the one end side in an opposite direction to a flowing-in direction is adopted. The refrigerant flow passage 2 allows a liquid refrigerant to circulate therein. A known liquid refrigerant, for example, an ethylene glycol aqueous solution and the like, can be applied as the refrigerant.

The refrigerant flow passage 2 is formed to pass a position of overlapping each of the four disposition regions (immediately below position) in plan view. A refrigerant flows through a position of overlapping each of the disposition region 10A, the disposition region 10B, the disposition region 10C, and the disposition region 10D in turn in the refrigerant flow passage 2, and absorbs heat generated from the objects to be cooled M when passing the position of overlapping each of the disposition regions 10. Accordingly, each of the objects to be cooled M is cooled. The refrigerant flow passage 2 is a flow passage having a substantially fixed thickness in the Z-direction. In the following description, in some cases, a position of each unit of the cooling device 100 is expressed as an upstream side or a downstream side with a direction along the flow of a refrigerant in the refrigerant flow passage 2 as reference. For example, out of the four disposition regions 10, the disposition region 10A is positioned on the most upstream side, and the disposition region 10D is positioned on the most downstream side.

The refrigerant flow passage 2 includes a first flow passage portion 21 that passes a position of overlapping a predetermined disposition region DR, out of the plurality of disposition regions 10, and a second flow passage portion 22 that passes a position of overlapping the other disposition regions 10 other than the predetermined disposition region DR.

The predetermined disposition region DR is a disposition region which is at a position where an allowance for a cooling capacity of the cooling device 100 becomes the smallest (a cooling capacity is likely to be insufficient), out of the plurality of disposition regions 10 provided in the cooling device 100. For example, in a case where there is no great difference in a heat generation amount of each of the objects to be cooled M, which is disposed in each of the disposition regions 10, an allowance for a cooling capacity in the object to be cooled M disposed in a disposition region positioned on the most downstream side is small. Therefore, a disposition region positioned on the most downstream side can be set (designed) as the predetermined disposition region DR. In addition, for example, in a case where heat generation amounts of the respective objects to be cooled M disposed in the respective disposition regions 10 are different from each other, an allowance for a cooling capacity of the cooling device 100 is small in the local heat generating units HS having the highest heat generation density. Therefore, a disposition region where the object to be cooled M including the local heat generating unit HS having the highest heat generation density is disposed can be set (designed) as the predetermined disposition region DR. In a case where there are a plurality of disposition regions where the object to be cooled M including the local heat generating units HS having a high heat generation density, a disposition region positioned on the most downstream side, out of the disposition regions, can be set (designed) as the predetermined disposition region DR. Which disposition region should be set as the predetermined disposition region DR can be determined based on a relationship between the heat generation density of the local heat generating unit HS and an increase in a refrigerant temperature. An example, in which the disposition region 10D on the most downstream side is the predetermined disposition region DR on an assumption that the respective objects to be cooled M are substantially the same (heat generation amounts are substantially equal to each other), will be described in the first embodiment.

Therefore, the first flow passage portion 21 is provided to pass a position of overlapping the predetermined disposition region DR on the most downstream side (the disposition region 10D) in the refrigerant flow passage 2. The second flow passage portion 22 passes a position of overlapping the disposition regions 10A, 10B, and 10C other than the predetermined disposition region DR (the disposition region 10D). Hereinafter, each flow passage portion of the refrigerant flow passage 2 along a flowing direction will be described.

Figure 4:
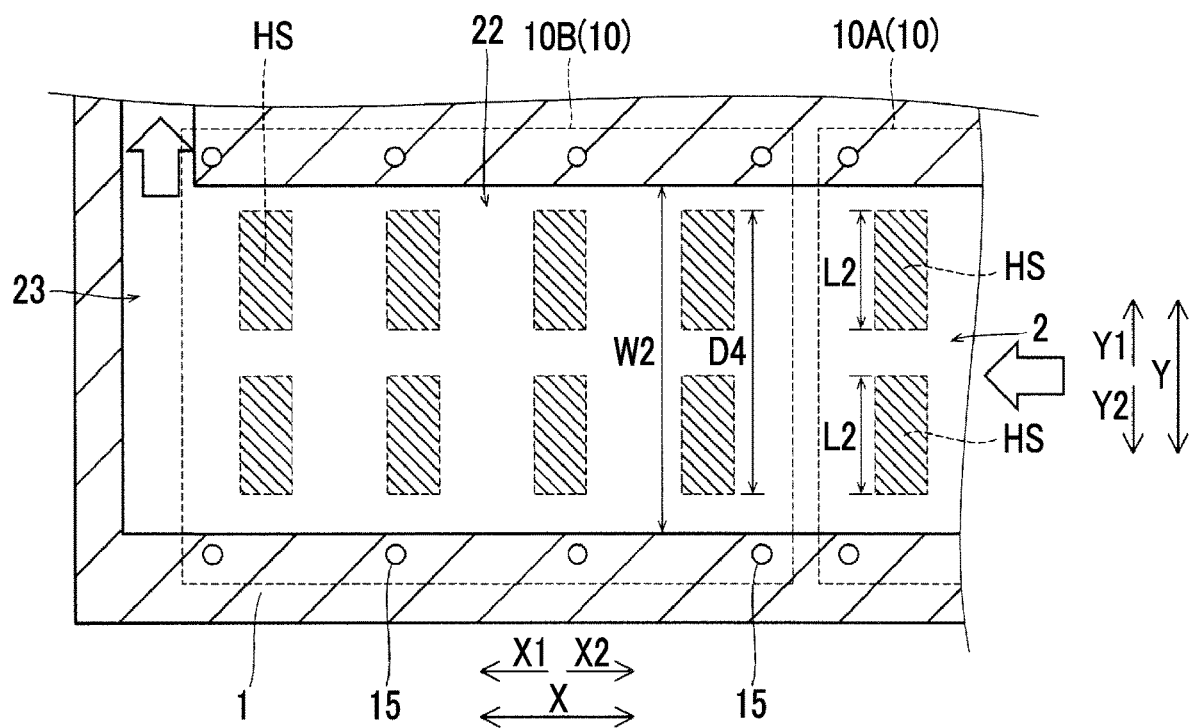
FIG. 4 is an enlarged view for illustrating a second flow passage portion of the refrigerant flow passage.

The second flow passage portion 22 is disposed upstream of the first flow passage portion 21 in the refrigerant flow passage 2. The second flow passage portion 22 is formed in a range of a distance D1 between the refrigerant inlet 3a and the turnback portion 23 and a range of a distance D2 between the turnback portion 23 and the first flow passage portion 21 in the X-direction. As illustrated in FIG. 4, the second flow passage portion 22 is formed in a linear shape having a fixed second flow passage width W2. The second flow passage portion 22 is formed to have the same flow passage width at a position of overlapping each of the disposition regions 10A, 10B, and 10C (refer to FIG. 3). A flow passage width is a width in a direction orthogonal to a refrigerant circulation direction in plan view (the Y-direction).

The second flow passage width W2 is larger than the length L2 of the local heat generating unit HS of each of the disposition regions 10 in the Y-direction. In addition, the second flow passage width W2 is larger than a distance D4 from one side end portion of the local heat generating unit HS on one side of the Y-direction to the other side end portion of the local heat generating unit HS on the other side of the Y-direction (a range including the plurality of local heat generating units HS in the Y-direction). For this reason, the second flow passage portion 22 is formed such that a region overlapping the plurality of local heat generating units HS fits in a range between wall surfaces in a flow passage width direction (the Y-direction) at the position of overlapping each of the disposition regions 10A, 10B, and 10C.

As illustrated in FIG. 3, the first flow passage portion 21 is disposed on the downstream side of the second flow passage portion 22. The first flow passage portion 21 is formed in a range of a distance D3 between a terminal end of the second flow passage portion 22, which extends from the turnback portion 23, and the refrigerant outlet 3b in the X-direction. The first flow passage portion 21 is formed in a linear shape extending in the X-direction.

Figure 5:
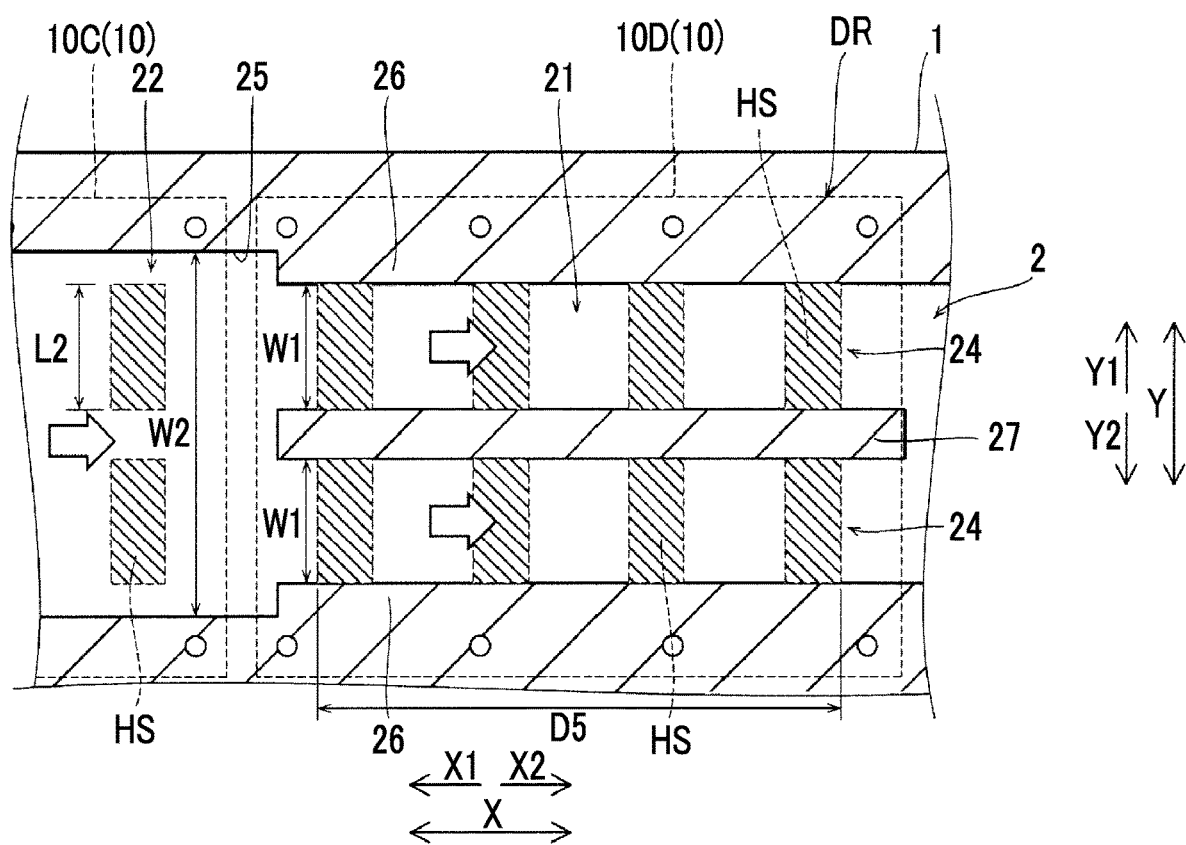
FIG. 5 is an enlarged view for illustrating a first flow passage portion of the refrigerant flow passage.

As illustrated in FIG. 5, the first flow passage portion 21 is formed at a predetermined position of overlapping a part of an inside of the predetermined disposition region DR to allow a refrigerant to pass therethrough more intensively than the second flow passage portion 22. The first flow passage portion 21 is disposed at a predetermined position of overlapping the local heat generating units HS of the object to be cooled M disposed in the predetermined disposition region DR. In other words, intensive cooling units 24 that intensively perform cooling are formed by the first flow passage portion 21 in the refrigerant flow passage 2 at the predetermined position of overlapping the local heat generating units HS.

The first flow passage portion 21 is disposed at the predetermined position of overlapping the local heat generating units HS of the object to be cooled M disposed in the predetermined disposition region DR. In an example of FIG. 5, in the object to be cooled M, there are two rows arranged in the Y-direction, each of which consists of four local heat generating units HS linearly arranged in the X-direction. For this reason, the first flow passage portion 21 includes the intensive cooling units 24 formed with two linear regions corresponding to the two rows of the local heat generating units HS in the Y-direction.

Each of the intensive cooling units 24 linearly extends in the X-direction to include a range of a distance D5 from the local heat generating unit HS, which is one end (an end portion in an X1-direction), to the local heat generating unit HS, which is the other end (an end portion in an X2-direction). A length D3 (refer to FIG. 3) of the first flow passage portion 21 in the refrigerant circulation direction (the X-direction) is equal to or larger than a range including the plurality of local heat generating units HS in the X-direction (the range of the distance D5). By allowing a refrigerant to intensively pass the two intensive cooling units 24 (predetermined position), the first flow passage portion 21 intensively cools each of the local heat generating units HS of the object to be cooled M disposed in the predetermined disposition region DR.

The first flow passage portion 21 branches off into two portions to correspond to the two intensive cooling units 24. By each of branched portions of the first flow passage portion 21 having a first flow passage width W1 smaller than the second flow passage width W2 of the second flow passage portion 22, the first flow passage portion is configured to allow a refrigerant to intensively pass the intensive cooling units 24 The total of the first flow passage widths W1 of the respective branched portions of the first flow passage portion 21 is smaller than the second flow passage width W2.

The first flow passage portion 21 is formed to have the first flow passage width W1 by guide wall portions 26 and 27 provided to narrow the flow passage width of the refrigerant flow passage 2 (the second flow passage portion 22). The narrow first flow passage portion 21 is formed by the guide wall portion 26, which projects more inward in the Y-direction than an inner wall surface 25 of the second flow passage portion 22 does, and the guide wall portion 27, which is formed as a flow passage that is disposed in the refrigerant flow passage 2 and causes the first flow passage portion 21 to branch off into two portions.

Figure 6:
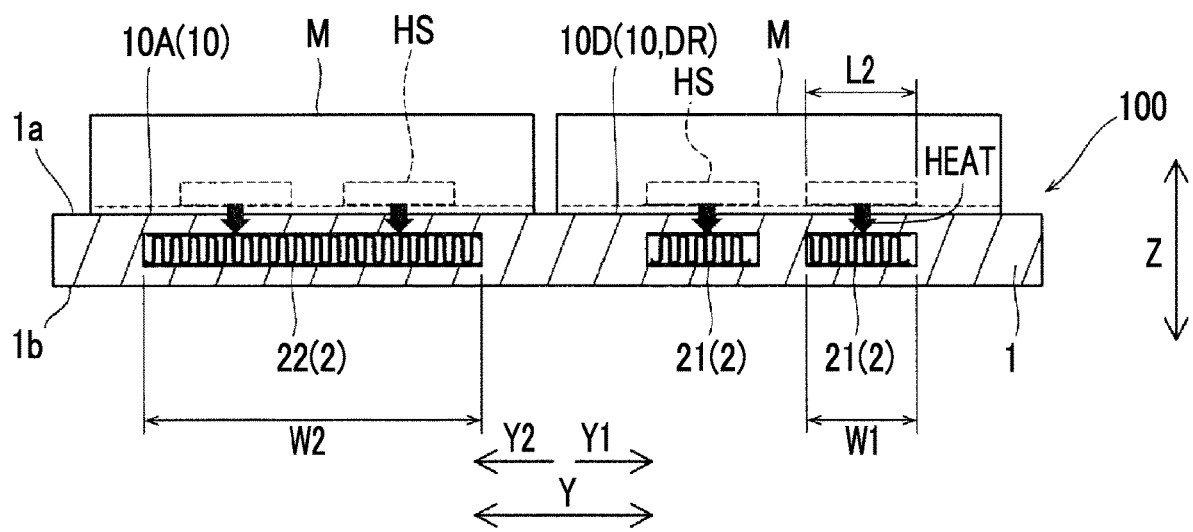
FIG. 6 is a longitudinal sectional view illustrating a position relationship between the first flow passage portion and the second flow passage portion, and a local heat generating unit.

In addition, the first flow passage width W1 of the first flow passage portion 21 is a size that is equal to or larger than the width of the local heat generating unit HS in the flow passage width direction (the Y-direction) (the length L2 or larger). The first flow passage width W1 substantially matches the width of the local heat generating unit HS (the length L2). Therefore, as illustrated in FIG. 6, the first flow passage portion 21 is formed to have the first flow passage width W1 that is equal to the width of the local heat generating unit HS of the object to be cooled M disposed in the predetermined disposition region DR (the length L2), and to pass immediately below the local heat generating unit HS.

Heat Transferring Fin

Referring back to FIG. 3, a plate-shaped heat transferring fin is provided in the refrigerant flow passage 2. That is, a heat transferring fin 31 is provided in the first flow passage portion 21, and a heat transferring fin 32 is provided in the second flow passage portion 22. For convenience of illustration, FIG. 3 schematically illustrates the heat transferring fins (31 and 32). In addition, illustration of the heat transferring fins is omitted in FIGS. 4 and 5. The heat transferring fin 31 in the first flow passage portion 21 and the heat transferring fin 32 in the second flow passage portion 22 are formed with, for example, corrugated fins (refer to FIGS. 7 and 8).

The heat transferring fin 32 in the second flow passage portion 22 is configured with a fin having a smaller pressure loss than the heat transferring fin 31 in the first flow passage portion 21. The pressure loss of the heat transferring fin can be adjusted mainly by the type of the heat transferring fin (fin shape) and a pitch in the flow passage width direction, and a pressure loss and a heat transferring capacity are in a trade-off relationship.

Figure 7:
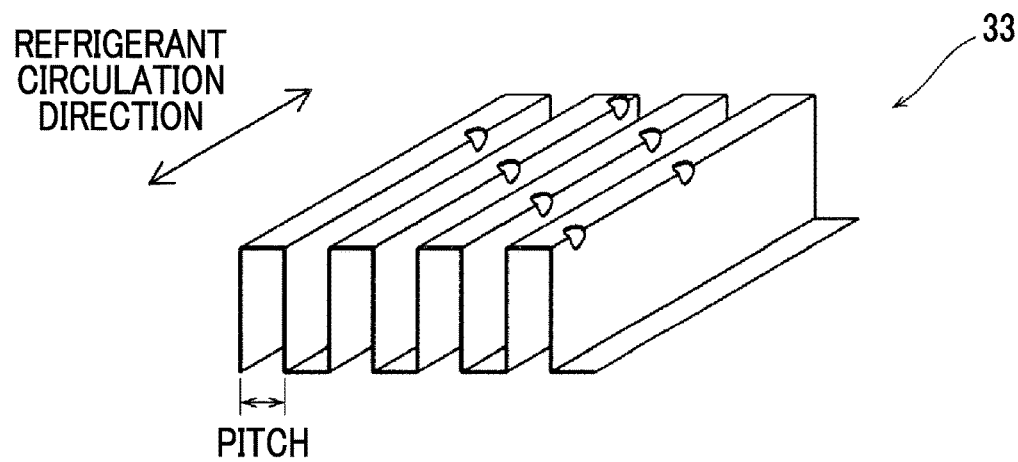
FIG. 7 is a perspective view illustrating an example of a linear fin.
Figure 8:
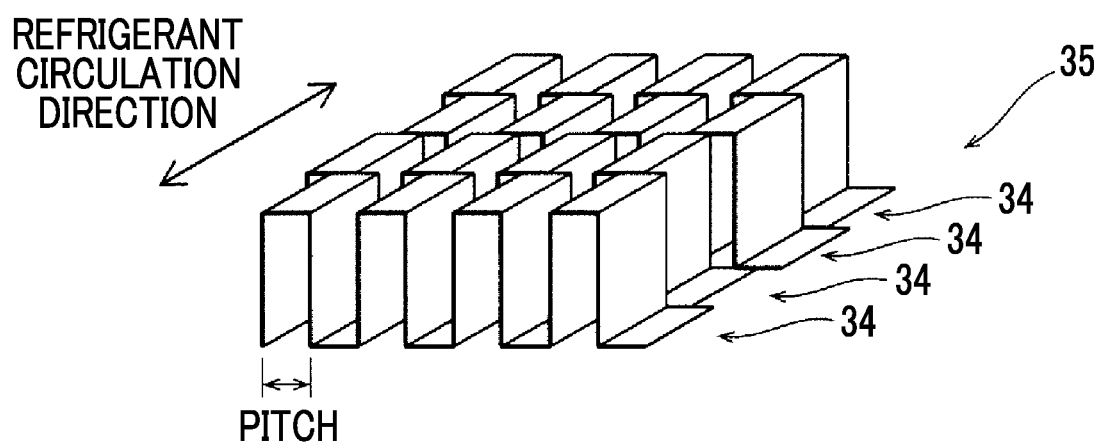
FIG. 8 is a perspective view illustrating an example of an offset fin.

A linear fin 33, such as a plain fin (not illustrated), which linearly extends in a flow passage length direction at a fixed pitch and a perforated fin, which is obtained by providing a plurality of through-holes in a plain fin, as illustrated in FIG. 7, can be adopted as a type of the heat transferring fin (fin shape). In addition, for example, as illustrated in FIG. 8, an offset fin (serrate fin) 35, which includes a plurality of fin portions 34 arranged in the refrigerant circulation direction and in which the plurality of fin portions 34 are formed to be shifted away from each other in the flow passage width direction, can be adopted. In a case where the pitch and the plate thickness are the same, a pressure loss and a heat transferring capacity are high in the order of the plain fin, the perforated fin, and the offset fin, which are listed in the order of having a smaller pressure loss and a lower heat transferring capacity. The smaller the pitch in the flow passage width direction, the greater a pressure loss and a heat transferring capacity.

The same type of fins are provided as the heat transferring fin 31 in the first flow passage portion 21 and the heat transferring fin 32 in the second flow passage portion 22. For example, the linear fin 33 (refer to FIG. 7), such as a perforated fin, is provided. However, a pitch in the flow passage width direction is different between the heat transferring fin 31 in the first flow passage portion 21 and the heat transferring fin 32 in the second flow passage portion 22. That is, the heat transferring fin 32 has a pitch larger than the pitch of the heat transferring fin 31.

A plurality of heat transferring fins 32a and 32b having different fin shapes or different pitches in flow passage width direction are provided in the second flow passage portion 22 such that the closer to the upstream side, the smaller a pressure loss. That is, the heat transferring fin 32 is configured with a plurality of types of heat transferring fins 32a and 32b. Specifically, in the second flow passage portion 22, the heat transferring fin 32a having a pitch P2a is provided in the range of the distance D1 in the X-direction, which passes a position of overlapping the disposition regions 10A and 10B, and the heat transferring fin 32b having a pitch P2b is provided in the range of the distance D2 in the X-direction, which passes a position of overlapping the disposition region 10C. The pitch P2a of the heat transferring fin 32a on the upstream side is larger than the pitch P2b of the heat transferring fin 32b on the downstream side.

A pitch P1 of the heat transferring fin 31 of the first flow passage portion 21 is smaller than the pitch P2a of the heat transferring fin 32a on the upstream side of the second flow passage portion 22. In a configuration example of FIG. 3, the pitch P1 of the heat transferring fin 31 of the first flow passage portion 21 substantially matches the pitch P2b of the heat transferring fin 32b, which is on the downstream side of the second flow passage portion 22. Therefore, a first half (upstream side) portion and a second half (downstream side) portion of the refrigerant flow passage 2 have different pitches.

The pitches P1, P2a, and P2b of the respective heat transferring fins are set to cancel out an increase in flow passage resistance of the first flow passage portion 21. That is, with a case where the entire refrigerant flow passage 2 has a fixed width, which is the second flow passage width W2, as reference, an increase in the pressure loss caused by the first flow passage portion 21 narrowing the flow passage width complements a decrease in the pressure loss caused by making the pitch P2a of the heat transferring fin 32a larger than the pitches P2b and P1 of the other heat transferring fins. As an example of the pitch, the pitch P2a of the heat transferring fin 32a which is on the upstream side of the second flow passage portion 22 is, for example, approximately, 2.1 mm, and the pitch P2b of the heat transferring fin 32b on the downstream side and the pitch P1 of the heat transferring fin 31 of the first flow passage portion 21 are, for example, approximately 1.4 mm.

Effect of Cooling Device

In the configuration described hereinbefore, a refrigerant is supplied to the refrigerant flow passage 2 from the refrigerant inlet 3a of the header unit 3. The refrigerant flows into the second flow passage portion 22 of the refrigerant flow passage 2, proceeds in the X1-direction by the distance D1, and flows to the turnback portion 23. After flowing in the turnback portion 23 in a Y1-direction, the refrigerant flows in an opposite direction to the X2-direction by the range of the distance D2 on the downstream side of the second flow passage portion 22 and then flows into the first flow passage portion 21. Since the first flow passage portion 21 branches off into the two portions and the flow passage width of each of the branched portions are narrowed, the flow rate of the refrigerant increases in the first flow passage portion 21. The refrigerant which has passed the first flow passage portion 21 flows out from the refrigerant outlet 3b.

Figure 9:
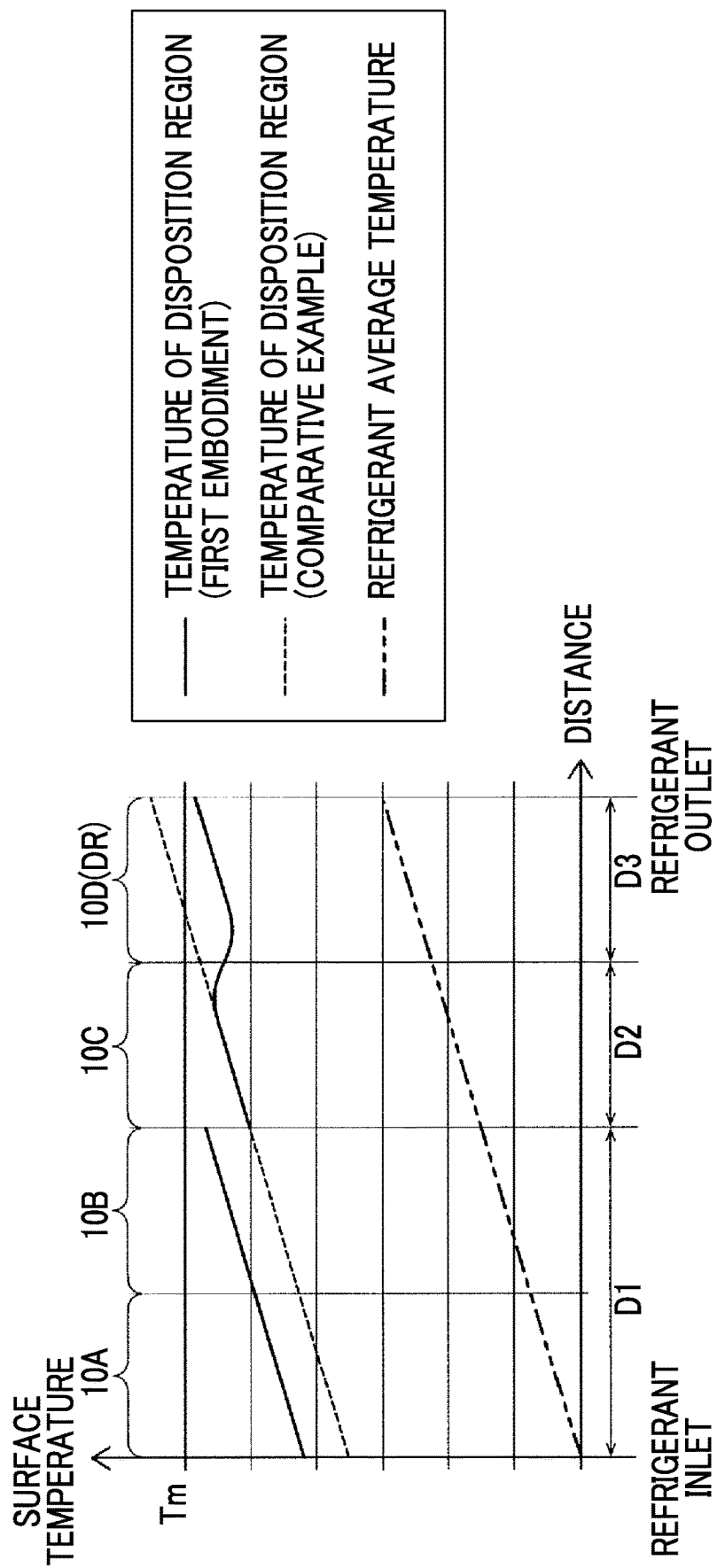
FIG. 9 is a diagram for showing a temperature change of the disposition region in the cooling device of the first embodiment and a temperature change of a disposition region in a comparative example.

FIG. 9 shows a relationship between each position in the refrigerant flow passage 2 during operation of the cooling device 100 and a surface temperature of the first surface 1a (an attachment surface temperature). The horizontal axis represents a distance from the refrigerant inlet 3a to the refrigerant outlet 3b (a position in the refrigerant flow passage 2), and the vertical axis represents the temperature of the first surface 1a. Although there is the turnback portion 23 between the disposition region 10B and the disposition region 10C, the turnback portion is omitted on the horizontal axis of FIG. 9 since cooling of the object to be cooled M is not performed in the turnback portion 23. A temperature change in the cooling device 100 of the first embodiment is indicated with a solid line of FIG. 9, and a refrigerant average temperature is indicated with a two-dot chain line. In addition, a temperature change in a cooling device having a configuration where flow passage widths of refrigerant flow passages are fixed (W2) and the heat transferring fin 32b (the pitch P2b) that is common to all the refrigerant flow passages is indicated with a dashed line as a comparative example. An allowable temperature of each of the disposition regions 10A to 10D will be referred to as Tm.

Since a refrigerant temperature is low in the second flow passage portion 22 on the upstream side (the second flow passage portion 22 formed in the range of the distance D1 in the X-direction) in the refrigerant flow passage 2, and a temperature difference between a surface temperature and a refrigerant temperature in each of the disposition regions 10A and 10B is large, there is an allowance in the cooling capacity in the first embodiment. For this reason, even when the heat transferring fin 32a, which has the large pitch P2a and has a relatively low heat transferring capacity, is provided in the second flow passage portion 22 on the upstream side, also heat generated by the local heat generating units HS with respect to the objects to be cooled M disposed in the disposition regions 10A and 10B is sufficiently absorbed by a refrigerant flowing in the second flow passage portion 22 on the upstream side. A temperature distribution of a refrigerant temperature is formed by a refrigerant which has passed immediately below the local heat generating units HS and a refrigerant which has passed a position of other than the local heat generating units HS. However, an average temperature increases as the refrigerant heads toward the downstream side.

When switching from the second flow passage portion 22 on the upstream side (the second flow passage portion 22 formed in the range of the distance D1 in the X-direction) to the second flow passage portion 22 on the downstream side (the second flow passage portion 22 formed in the range of the distance D2 in the X-direction), the heat transferring fin 32a having the pitch P2a is switched to the heat transferring fin 32b having the pitch P2b. By switching to the heat transferring fin 32b having the pitch P2b, a heat transferring capacity improves more than that of the second flow passage portion 22 on the upstream side. Therefore, the surface temperature of the disposition region 10C temporarily declines, and then increases. Since there is an allowance from the allowable temperature Tm in the disposition region 10C, a sufficient cooling capacity with respect to the object to be cooled M disposed in the disposition region 10C can be obtained. The average temperature of a refrigerant temperature further increases, and an allowance for a cooling capacity becomes small.

Since the disposition region 10D (the predetermined disposition region DR) is in a state where a refrigerant temperature (the refrigerant average temperature) has increased, an allowance for a cooling capacity becomes small. For this reason, a surface temperature is likely to reach the allowable temperature Tm in the predetermined disposition region DR at the position of overlapping the local heat generating units HS of the object to be cooled M disposed in the predetermined disposition region DR. In the first embodiment, a refrigerant intensively passes the position immediately below the local heat generating units HS by the first flow passage portion 21 having the first flow passage width W1, and thus the flow rate of the refrigerant increases. Accordingly, even in a state where heat generated in the local heat generating units HS is efficiently absorbed by the refrigerant flowing in the first flow passage portion 21, and the refrigerant temperature has increased, the local heat generating units HS are sufficiently cooled. In addition, since the refrigerant flow passage 2 is narrowed by the first flow passage portion 21 having the first flow passage width W1 as illustrated in FIG. 5, a low-temperature refrigerant which has passed immediately below portions other than the local heat generating units HS in the second flow passage portion 22 and a high-temperature refrigerant which has passed immediately below the local heat generating units HS are mixed in the first flow passage portion 21, and thus the refrigerant which has a substantially average temperature passes immediately below the local heat generating units HS. For this reason, a cooling capacity with respect to the local heat generating units HS in the first flow passage portion 21 increases with the use of the low-temperature refrigerant which has not passed immediately below the local heat generating units HS in the second flow passage portion 22. Accordingly, the desired cooling capacity of the cooling device 100 can be secured with respect to the object to be cooled M disposed in the predetermined disposition region DR where an allowance for a cooling capacity becomes small.

In a case of the comparative example, since the pitch of the heat transferring fin mounted in the refrigerant flow passage is small compared to the first embodiment, the surface temperature becomes low in the disposition regions 10A and 10B on the upstream side while the surface temperature monotonically increases toward the downstream side. As a result, in the comparative example, the surface temperature reaches the allowable temperature Tm in the disposition region 10D. As described above, a temperature distribution is formed by the refrigerant which has passed immediately below the local heat generating units HS and the refrigerant which has passed a position immediately below portions other than the local heat generating units HS. Therefore, in the case of comparative example in which the first flow passage portion 21 is not provided, the high-temperature refrigerant passes immediately below the local heat generating units HS. For this reason, the surface temperature is likely to exceed the allowable temperature Tm particularly at a position of overlapping the local heat generating units HS.

By intensively cooling the local heat generating units HS in the disposition region 10D (the predetermined disposition region DR) where an allowance for a cooling capacity particularly becomes small in this manner, it is suppressed that the surface temperature exceeds the allowable temperature Tm in the first embodiment.

Effects of First Embodiment

The following effects can be obtained in the first embodiment.

As described above, the refrigerant flow passage 2 including the first flow passage portion 21 that passes the position of overlapping the predetermined disposition region DR out of the plurality of disposition regions 10 and the second flow passage portion 22 that passes the position of overlapping the other disposition regions 10 other than the predetermined disposition region DR is provided, and the first flow passage portion 21 is formed at the predetermined position (the intensive cooling units 24) of overlapping a part of the inside of the predetermined disposition region DR to allow a refrigerant to pass therethrough more intensively than the second flow passage portion 22. Accordingly, the flow rate of the refrigerant can be increased by causing the refrigerant to intensively flow at the predetermined position (the intensive cooling units 24) in the first flow passage portion 21, and thus a cooling capacity with respect to a part positioned immediately above the predetermined position (the intensive cooling units 24) can be locally improved. Therefore, it is possible to suppress local insufficiency of the cooling capacity (the temperature of the object to be cooled M locally exceeds the allowable temperature Tm) by disposing the object to be cooled M such that a portion that particularly requires cooling is positioned immediately above the first flow passage portion (the intensive cooling units 24) in consideration of a heat generation distribution inside the object to be cooled M.

As in FIG. 3, in a case where the first flow passage portion 21 is disposed in accordance with the predetermined disposition region DR that requires a cooling capacity most, out of the plurality of disposition regions 10, insufficiency of a cooling capacity in a portion that requires cooling most can be suppressed. Thus, it is possible to secure a sufficient cooling capacity for the entire refrigerant flow passage 2 with respect to each of the objects to be cooled M. By providing the second flow passage portion 22, which can suppress a pressure loss to be small instead of allowing a refrigerant to flow therethrough as intensively as the first flow passage portion 21, at the position of overlapping the other disposition regions 10 (10A, 10B, and 10C) where there is an allowance in a cooling capacity, an increase in a pressure loss caused by the first flow passage portion 21 can be canceled out, and thus an increase in a pressure loss in the entire cooling device 100 can be suppressed. As a result, an increase in a pressure loss of the entire the cooling device 100 can be suppressed and local insufficiency of a cooling capacity can be suppressed so as to secure a sufficient cooling capacity with respect to the object to be cooled M.

In addition, the first flow passage portion 21 is disposed at the predetermined position of overlapping the local heat generating units HS of the object to be cooled M disposed in the predetermined disposition region DR as described above. Accordingly, since the first flow passage portion 21 can be disposed at the position of overlapping the local heat generating units HS, which have a particularly high heat generation density, of the objects to be cooled M, insufficiency of a cooling capacity caused by local heat generation of the object to be cooled M can be reliably and effectively suppressed.

In addition, by forming the first flow passage portion 21 to have the first flow passage width W1 smaller than the second flow passage width W2 of the second flow passage portion 22 as described above, the first flow passage portion is configured to allow a refrigerant to intensively pass the predetermined position (the intensive cooling units 24). Accordingly, the flow rate of the refrigerant can be easily increased by concentrating the refrigerant at the predetermined position (the intensive cooling units 24), and thus a local cooling capacity can be increased. In addition, since the second flow passage width W2 of the second flow passage portion 22 can be made relatively large, a pressure loss of the second flow passage portion 22 can be suppressed to be small, and thus an increase in a pressure loss of the entire cooling device 100 can be suppressed.

In addition, the first flow passage width W1 of the first flow passage portion 21 is a size that is equal to or larger than the width (L2) of the local heat generating unit HS in the flow passage width direction (the Y-direction) as described above. Accordingly, even in a case where the first flow passage width W1 is made smaller than the second flow passage width W2, the first flow passage portion 21 can be formed in a range of overlapping at least all the local heat generating units HS. As a result, the local heat generating units HS can be effectively cooled by raising the flow rate of the refrigerant in the first flow passage portion 21 and cooling all the local heat generating units HS.

In addition, the heat transferring fin 32a in the second flow passage portion 22 is configured with the fin having a smaller pressure loss than the heat transferring fin 31 in the first flow passage portion 21 as described above. Accordingly, a pressure loss in the second flow passage portion 22 where there is an allowance in a cooling capacity can be suppressed to be small not only by making the second flow passage width W2 in the second flow passage portion 22 relatively large but also by providing the heat transferring fin 32a, which has a pressure loss smaller than the heat transferring fin 31 in the first flow passage portion 21, in the second flow passage portion 22. As a result, an increase in a pressure loss in the entire cooling device 100 can be suppressed.

In addition, as described above, the heat transferring fins 32a and 32b are provided in the second flow passage portion 22 such that the closer to the upstream side, the smaller a pressure loss. In an example illustrated in FIG. 3, the plurality of heat transferring fins 32a and 32b having different pitches in the flow passage width direction are provided in the second flow passage portion 22 such that the closer to the upstream side, the smaller a pressure loss. By providing the heat transferring fins 32a and 32b such that the closer to the upstream side on which there is an allowance in a cooling capacity, the smaller a pressure loss and a heat transferring capacity, the pressure loss and the heat transferring capacity can be adjusted according to an allowance for a cooling capacity. Therefore, the cooling capacity can be secured and an increase in the pressure loss of the cooling device 100 can be suppressed more effectively.

In addition, out of the plurality of disposition regions 10, the disposition region 10D positioned on the most downstream side of the refrigerant flow passage 2 is set as the predetermined disposition region DR as described above. Herein, in a case where there is no great difference in a heat generation amount of each of the objects to be cooled M disposed in the plurality of disposition regions 10, a cooling capacity is likely to become insufficient for the object to be cooled M disposed in the disposition region 10D on the most downstream side. For this reason, insufficiency of a cooling capacity caused by local heat generation of the object to be cooled M can be more effectively suppressed by setting the disposition region 10D positioned on the most downstream side of the refrigerant flow passage 2 as the predetermined disposition region DR and disposing the first flow passage portion 21 at the predetermined position (the intensive cooling units 24) of overlapping the local heat generating units HS of the object to be cooled M disposed in the predetermined disposition region DR.

Second Embodiment

Next, a second embodiment will be described with reference to FIG. 10. Unlike the first embodiment in which the disposition region 10D positioned on the most downstream side of the refrigerant flow passage 2, out of the plurality of disposition regions 10, is set as the predetermined disposition region DR, an example in which a disposition region (the disposition region 10C) where the object to be cooled M including the local heat generating units HS having the highest heat generation density is disposed, out of the plurality of disposition regions 10, is set as the predetermined disposition region DR will be described in the second embodiment.

In the second embodiment, it is assumed that heat generation amounts of the respective objects to be cooled M disposed in the respective disposition regions 10 are different from each other. An example in which a heat generation amount of the object to be cooled M disposed in the disposition region 10C, out of the respective objects to be cooled M, is the largest is given. More specifically, the heat generation density of each of the local heat generating units HS of the object to be cooled M disposed in the disposition region 10C, out of the respective objects to be cooled M, is the highest heat generation density. Thus, the disposition region 10C where the object to be cooled M including each of the local heat generating units HS having the highest heat generation density is disposed is set (designed) as the predetermined disposition region DR.

Figure 10:
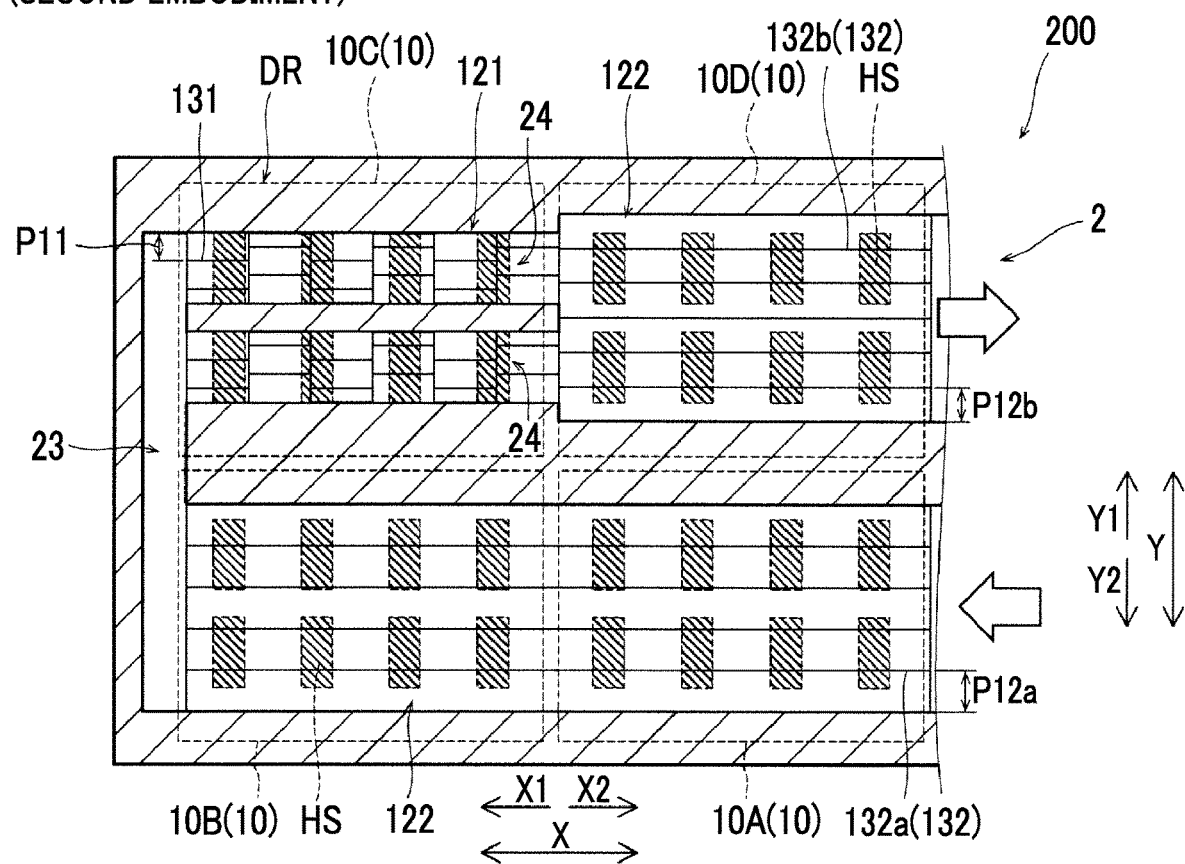
FIG. 10 is a horizontal sectional view schematically illustrating a refrigerant flow passage of a cooling device according to a second embodiment.

As illustrated in FIG. 10, in a cooling device 200, a first flow passage portion 121 is disposed at a predetermined position of overlapping the local heat generating units HS (the local heat generating units HS having the highest heat generation density) of the object to be cooled M disposed in the predetermined disposition region DR, out of the plurality of disposition regions 10. That is, in a configuration example of the refrigerant flow passage 2 of FIG. 10, each of the intensive cooling units 24 is formed by the first flow passage portion 121 at the predetermined position of overlapping each of the local heat generating units HS of the object to be cooled M disposed in the disposition region 10C.

A second flow passage portion 122 is disposed at a position of overlapping the disposition regions 10A, 10B, and 10D, out of the plurality of disposition regions 10. For this reason, the second flow passage portion 122 is disposed on an upstream side and a downstream side of the first flow passage portion 121, and the first flow passage portion 121 is disposed in a middle position instead of the most downstream side of the refrigerant flow passage 2.

A shape and a flow passage width of the first flow passage portion 121 are the same as those of the first flow passage portion 21 in the first embodiment. The object to be cooled M having a different heat generation amount is different from the other objects to be cooled M in terms of the shape and the disposition of the local heat generating units HS. In this case, the shape and the flow passage width of the first flow passage portion 121 are formed in accordance with the local heat generating units HS of the object to be cooled M disposed in the predetermined disposition region DR.

In addition, different types (shape) of fins, including a heat transferring fin 132 in the second flow passage portion 122 and a heat transferring fin 131 in the first flow passage portion 121, are adopted. For example, the heat transferring fin 132 in the second flow passage portion 122 corresponds to the linear fin 33 extending in the refrigerant circulation direction (refer to FIG. 7). For example, the linear fin 33 is a plain fin or a perforated fin. For example, the heat transferring fin 131 in the first flow passage portion 121 is an offset fin 35 (refer to FIG. 8).

In the second flow passage portion 122, a heat transferring fin 132a in the second flow passage portion 122a on the upstream side, which passes a position of overlapping the disposition regions 10A and 10B, has a pitch P12a. The heat transferring fin 132b in the second flow passage portion 122b on the downstream side, which passes a position of overlapping the disposition region 10D, has a pitch P12b. The pitch P12a of the heat transferring fin 132a on the upstream side is larger than the pitch P12b of the heat transferring fin 132b on the downstream side.

The heat transferring fin 131 in the first flow passage portion 121 has a pitch P11. The pitch P11 of the heat transferring fin 131 is equal to, for example, the pitch P12b of the heat transferring fin 132b on the downstream side.

Other configurations of the second embodiment are the same as the configurations of the first embodiment.

Effects of Second Embodiment

By forming the first flow passage portion 121 at the predetermined position (the intensive cooling units 24) of overlapping a part of an inside of the predetermined disposition region DR to allow a refrigerant to pass therethrough more intensively than the second flow passage portion 122 as in the first embodiment, an increase in a pressure loss of the entire the cooling device 200 can be suppressed and local insufficiency of a cooling capacity can be suppressed so as to secure a sufficient cooling capacity with respect to the object to be cooled M also in the second embodiment.

In addition, as described above, out of the plurality of disposition regions 10, the disposition region 10C where the object to be cooled M including each of the local heat generating units HS having the highest heat generation density is disposed, out of the plurality of disposition regions 10, is set as the predetermined disposition region DR. Herein, in a case where heat generation amounts of the objects to be cooled M disposed in the plurality of disposition regions 10 are different from each other, a cooling capacity is likely to become insufficient for the local heat generating units HS having the highest heat generation density. For this reason, insufficiency of a cooling capacity caused by local heat generation of the object to be cooled M can be more effectively suppressed by setting the disposition region 10C where the object to be cooled M including the local heat generating units HS having the highest heat generation density is disposed as the predetermined disposition region DR and disposing the first flow passage portion 121 at the predetermined position (the intensive cooling units 24) of overlapping the local heat generating units HS of the object to be cooled M disposed in the predetermined disposition region DR.

In addition, the heat transferring fin 132 in the second flow passage portion 122 is configured with the linear fin 33, and the heat transferring fin 131 in the first flow passage portion 121 is configured with the offset fin 35 as described above. That is, the linear fin 33 having a low heat transferring capacity with a small pressure loss is provided in the second flow passage portion 122 that relatively has an allowance in a cooling capacity, and the offset fin 35 having a high heat transferring capacity with a great pressure loss is provided in the first flow passage portion 121 that relatively requires a cooling capacity. As a result, a cooling capacity with respect to each of the plurality of objects to be cooled M can be optimized in response to each heat generation while suppressing an increase in a pressure loss of the entire cooling device 200. In addition, for example, when a refrigerant having a temperature difference flows in the first flow passage portion 121, such as when a refrigerant, which has passed the position of overlapping the local heat generating units HS and has been warmed in the second flow passage portion 122, and a low-temperature refrigerant, which has passed a place where there is not much heat generation (which has passed a position of overlapping a portion other than the local heat generating units HS), flow into the first flow passage portion 121, the offset fin 35 stirs the refrigerants, a refrigerant temperature averages, and thereby a cooling capacity can be maintained. Therefore, the local heat generating units HS can be effectively cooled.

Other effects of the second embodiment are the same as the effects of the first embodiment.

Third Embodiment

Figure 11:
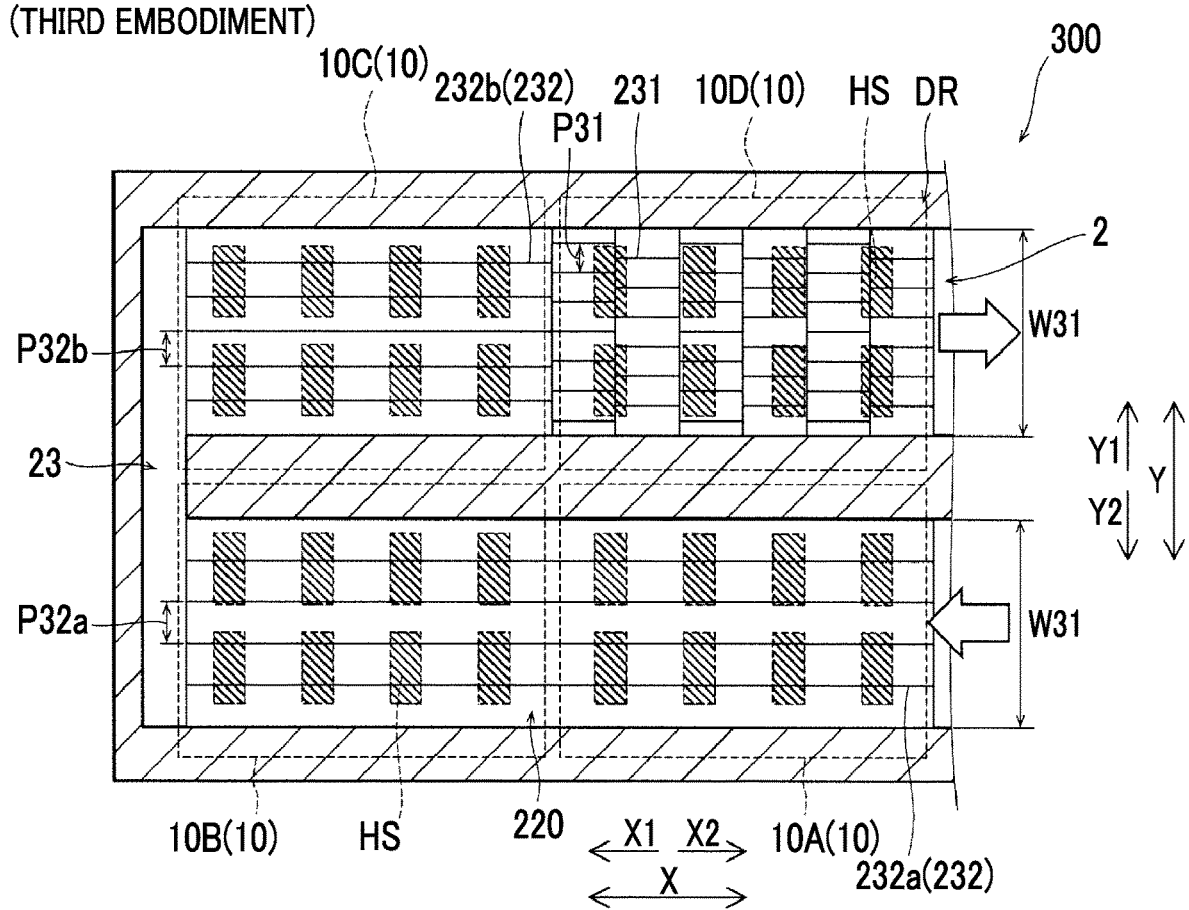
FIG. 11 is a horizontal sectional view schematically illustrating a refrigerant flow passage of a cooling device according to a third embodiment.

Next, a third embodiment will be described with reference to FIG. 11. Unlike the first and second embodiments in which the first flow passage portion and the second flow passage portion, which have flow passage widths different from each other, are provided in the refrigerant flow passage 2, an example in which the first flow passage portion and the second flow passage portion are not provided and a flow passage width of the refrigerant flow passage 2 is fixed will be described in the third embodiment.

An example, in which the disposition region 10D on the most downstream side is set as the predetermined disposition region DR on an assumption that the respective objects to be cooled M are substantially the same (heat generation amounts are substantially equal to each other) as in the first embodiment, will be described in the third embodiment.

In a cooling device 300, the refrigerant flow passage 2 includes a flow passage portion 220 and the turnback portion 23. The flow passage portion 220 is a linear flow passage having a fixed flow passage width W31 on an upstream side and a downstream side of the turnback portion 23.

The refrigerant flow passage 2 includes a first heat transferring fin 231 disposed at a position of overlapping the predetermined disposition region DR (the disposition region 10D), out of the plurality of disposition regions 10, and a second heat transferring fin 232 disposed at position of overlapping the other disposition regions 10 (10A, 10B, and 10C) other than the predetermined disposition region DR. The first heat transferring fin 231 is disposed on the downstream side of the second flow passage portion 232.

Fins having different capacities are adopted in the first heat transferring fin 231 and the second heat transferring fin 232. The first heat transferring fin 231 is formed with the offset fin 35 (refer to FIG. 8), which is different from the second heat transferring fin 232, and has a greater pressure loss and a higher heat transferring capacity than the second heat transferring fin 232. The second heat transferring fin 232 is formed with the linear fin 33 (refer to FIG. 7). The linear fin 33 may be a plain fin (not illustrated), or may be a perforated fin (refer to FIG. 7).

By providing the offset fin 35 (the first heat transferring fin 231), which has a greater pressure loss and a higher heat transferring capacity than the second heat transferring fin 232, at the position of overlapping the predetermined disposition region DR, firstly, a heat radiating capacity improves by the higher-capacity fin than the other disposition regions 10. Secondly, due to the stirring effect of the offset fin 35, a refrigerant temperature distribution averages. A high-temperature refrigerant, which has passed the position of overlapping the local heat generating units HS of the disposition region 10C on the upstream side and has been warmed, and a (relatively) low-temperature refrigerant, which has not passed the position of overlapping the local heat generating units HS, reach the first heat transferring fin 231 from the second heat transferring fin 232 formed with the linear fin 33 with a temperature distribution maintained. By the first heat transferring fin 231 stirring the refrigerants, the relatively low-temperature refrigerant having the averaged temperature distribution is supplied to immediately below the local heat generating units HS of the predetermined disposition region DR.

A pitch in the flow passage width direction of the second heat transferring fin 232 is larger than that of the first heat transferring fin 231. The second heat transferring fin 232 is configured to cancel out an increase in a pressure loss caused by the first heat transferring fin 231.

In addition, the second heat transferring fin 232 is configured with a plurality of heat transferring fins (232a and 232b) having different pitches in the flow passage width direction such that the closer to the upstream side, the smaller a pressure loss. A pitch of the second heat transferring fin 232a that is provided to correspond to the disposition region 10A and the disposition region 10B, which are on the upstream side, and a pitch of the second heat transferring fin 232b that is provided to correspond to the disposition region 10C on the downstream side are made different.

Specifically, a pitch P32a of the second heat transferring fin 232a is larger than a pitch P32b of the second heat transferring fin 232b. In addition, the pitch P32b of the second heat transferring fin 232b is larger than a pitch P31 of the first heat transferring fin 231.

For example, the pitch P32a of the second heat transferring fin 232a is approximately 2.1 mm. The pitch P32b of the second heat transferring fin 232b is approximately 1.4 mm. The pitch P31 of the first heat transferring fin 231 is approximately 1.3 mm.

Other configurations of the third embodiment are the same as the configurations of the first embodiment.

Effects of Third Embodiment

As described above, the refrigerant flow passage 2 including the first heat transferring fin 231 disposed at the position of overlapping the predetermined disposition region DR, out of the plurality of disposition regions 10, and the second heat transferring fin 232 disposed at the position of overlapping the other disposition regions 10 other than the predetermined disposition region DR is provided. The first heat transferring fin 231 is configured with the offset fin 35 which has a greater pressure loss and a higher heat transferring capacity than the second heat transferring fin 232. Accordingly, the first heat transferring fin 231 can stir a refrigerant by means of the offset fin 35, in addition to having a higher heat transferring capacity than the second heat transferring fin 232. Therefore, by disposing the object to be cooled M such that a portion that particularly requires cooling (the local heat generating units HS) is at the position of overlapping the first heat transferring fin 231 in consideration of a heat generation distribution inside the object to be cooled M, a refrigerant warmed at a local heat generation place and a low-temperature refrigerant at a place where there is not much heat generation are stirred, a refrigerant temperature averages, and thereby a cooling capacity can be maintained. Thus, it is possible to suppress local insufficiency of the cooling capacity (the temperature of the object to be cooled M locally exceeds the allowable temperature Tm) due to local heat generation. If the first heat transferring fin 231 is disposed in accordance with the predetermined disposition region DR that requires a cooling capacity most, out of the plurality of disposition regions 10 where the respective objects to be cooled M are disposed, it is possible to secure a sufficient cooling capacity for the entire refrigerant flow passage 2 with respect to each of the objects to be cooled M. By providing the second heat transferring fin 232 that is formed with the linear fin 33, which has a smaller pressure loss than the first heat transferring fin 231, in the other disposition regions 10 where there is an allowance in a cooling capacity, an increase in a pressure loss caused by the first heat transferring fin 231 can be canceled out, and thus an increase in a pressure loss in the entire cooling device 300 can be suppressed. As a result, an increase in a pressure loss of the entire the cooling device 300 can be suppressed and local insufficiency of a cooling capacity can be suppressed so as to secure a sufficient cooling capacity with respect to the object to be cooled M.

It should be considered that the embodiments disclosed this time are merely examples in all respects, and are not restrictive. The scope of the present invention is expressed by the scope of the claims not by the description of the embodiments, and further includes all modifications (modification examples) having a meaning and a scope equivalent to the scope of the claims.

For example, although an example in which the object to be cooled M is a power module including a switching element for power control is given in the first to third embodiments, the present invention is not limited thereto. In the present invention, the object to be cooled may be any object. Since a cooling capacity is concentrated on the predetermined position, focusing on a heat generation distribution of the object to be cooled, the present invention is particularly effective in cooling the object to be cooled, which includes a heat generation source therein and has a large amount of local heat generation.

In addition, although an example in which the present invention is applied to a plate-shaped cold plate having a one-layered refrigerant flow passage is given in the first to third embodiments, the present invention is not limited thereto. A plurality of layers of refrigerant flow passages may be formed in the main body unit. In addition, the disposition regions 10 may also be provided on the second surface (lower surface) 1b in addition to providing the disposition regions 10 on the first surface (upper surface) 1a of the main body unit 1.

In addition, although an example in which four disposition regions 10 are provided is given in the first to third embodiments, the present invention is not limited thereto. It is preferable to provide a plurality of disposition regions, and two, three, or five or more disposition regions may be provided in the present invention. In addition, also the size and shape of the disposition region may be any size and any shape, and may be set as appropriate according to the shape of the object to be cooled, which is to be disposed.

In addition, although an example in which the U-shaped refrigerant flow passage 2 provided with the turnback portion 23 is given in the first to third embodiments, the present invention is not limited thereto. A linear refrigerant flow passage that is not provided with the turnback portion may be adopted in the present invention. In addition, a refrigerant flow passage that is provided with a plurality of turnback portions and has a shape of meandering at one end and the other end of the main body unit may be adopted.

In addition, although the linear fin 33 (a plain fin or a perforated fin) and the offset fin 35 are given as examples of the heat transferring fin in the first to third embodiments, the present invention is not limited thereto. In addition to these fins, a louver fin or a herringbone fin may be adopted as the heat transferring fin in the present invention.

In addition, an example of a configuration where a refrigerant is caused to intensively pass the predetermined position (the intensive cooling units 24) by narrowing the flow passage width of the first flow passage portion 21 (the first flow passage width W1) is given in the first and second embodiments, the present invention is not limited thereto. In the present invention, a refrigerant may be caused to intensively pass the predetermined position (the intensive cooling units 24) by providing a guiding unit in the first flow passage portion 21.

Figure 12:
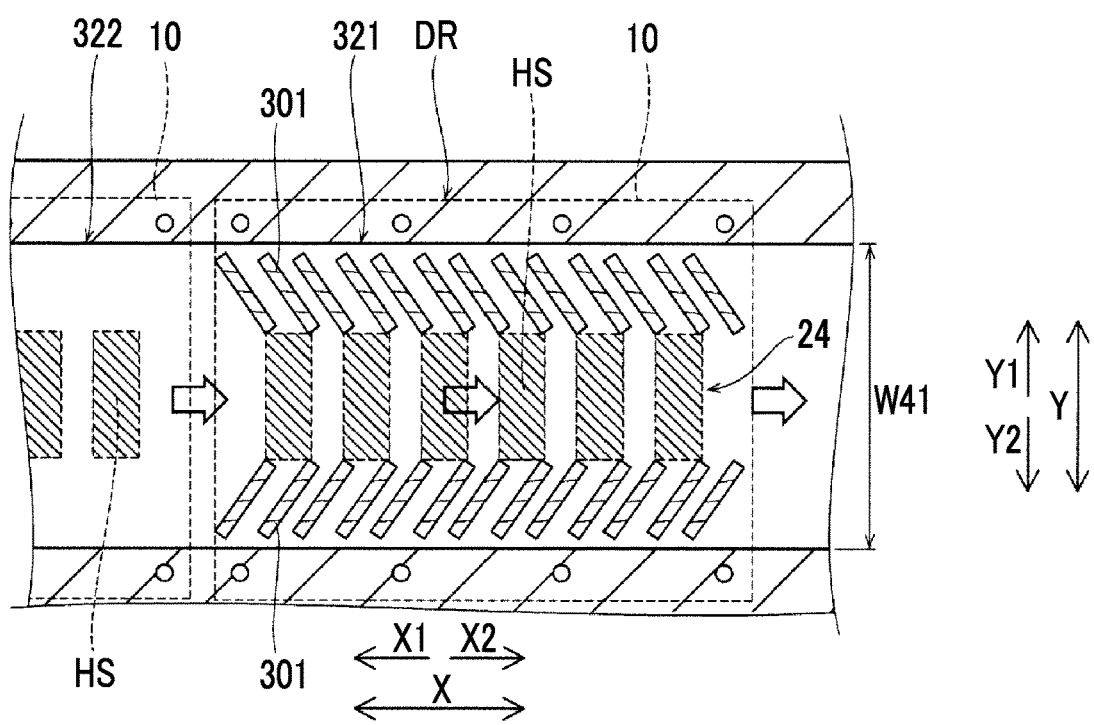
FIG. 12 is an enlarged view illustrating a modification example of a first flow passage portion.

In a modification example illustrated in FIG. 12, a first flow passage portion 321 has a flow passage width W41 that is equal to that of a second flow passage portion 322, and has guiding units 301 for concentrating a refrigerant at the predetermined position (the intensive cooling units 24). Each of the guiding units 301 can be configured with a plate-shaped portion (guiding wall) inclined to concentrate the flow of a refrigerant at the predetermined position (the intensive cooling units 24). Most of the refrigerant flowing in the first flow passage portion 21 is guided to the intensive cooling units 24 by the guiding units 301. As a result, the flow rate increases at the intensive cooling units 24, and thus a cooling capacity improves. In the modification example, other part of the refrigerant flowing in the first flow passage portion 21 passes an outer side of the guiding units 301 and flows out from the first flow passage portion 21 to the downstream side without passing the intensive cooling units 24.

As illustrated in FIG. 12, the local heat generating units HS are not required to be formed so as to be arranged in two rows with respect to the object to be cooled M, and also the shape of each of the local heat generating units HS may be any shape.

Figure 13:
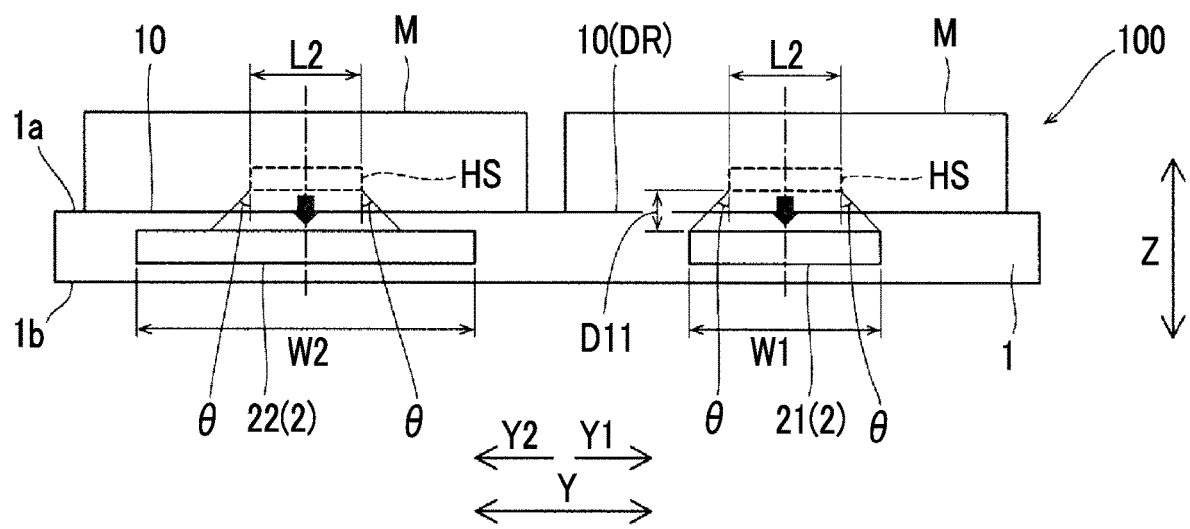
FIG. 13 is a longitudinal sectional view schematically illustrating a modification example of a first flow passage width of a first flow passage portion.

In addition, although an example in which the first flow passage width W1 of the first flow passage portion 21 matches the width (the length L2) of the local heat generating unit HS in the flow passage width direction (the Y-direction) is given in the first and second embodiments, the present invention is not limited thereto. In the present invention, the first flow passage width W1 may be larger than the width (the length L2) of the local heat generating unit HS. For example, as in a modification example of FIG. 13, the first flow passage width W1 may be made larger than the width (the length L2) of the local heat generating unit HS by the amount of heat diffusion between the local heat generating unit HS and the first flow passage portion 21. In this case, based on an angle $\theta$ of heat diffusion from the local heat generating unit HS and a distance D11 between the local heat generating unit HS and the first flow passage portion 21, it is preferable to set the first flow passage width W1 such that heat diffused at the angle $\theta$ is absorbed by the first flow passage portion 21. If the angle $\theta$ of heat diffusion is 45°, it is preferable to set the first flow passage width W1 to a width that is larger than the width (the length L2) of the local heat generating unit HS by the distance D11 on both sides.

REFERENCE SIGNS LIST

1: main body unit
2: refrigerant flow passage
(10A to 10D): disposition region
21, 121: first flow passage portion
22, 122: second flow passage portion
31, 131: heat transferring fin (heat transferring fin of first flow passage portion)
(32a, 32b), 132 (132a, 132b): heat transferring fin (heat transferring fin of second flow passage portion)
33: linear fin
34: fin portion
35: offset fin
100, 200, 300: cooling device
231: first heat transferring fin
232 (232a, 232b): second heat transferring fin
HS: local heat generating unit
M: object to be cooled

The invention claimed is:

1. A cooling device comprising:
a main body unit that has, on a surface thereof, a plurality of disposition regions where a power module is disposed, the power module including a plurality of switching elements for power control; and
a refrigerant flow passage provided in the main body unit, wherein
the refrigerant flow passage includes a first flow passage portion that passes a position of overlapping a predetermined disposition region out of the plurality of disposition regions and a second flow passage portion that passes a position of overlapping the other disposition regions other than the predetermined disposition region,
the first flow passage portion is formed at a predetermined position of overlapping a part of an inside of the predetermined disposition region to allow a refrigerant to pass therethrough more intensively than a flow of the refrigerant through the second flow passage portion,
the first flow passage portion is formed to branch off into a plurality of branched portions to correspond to a plurality of the predetermined positions each overlapping the plurality of switching elements of the power module disposed in the predetermined disposition region,
a total width of first flow passage widths of the respective branched portions is smaller than a second flow passage width, and
each of the first flow passage widths of the respective branched portions is smaller than a width of the power module and corresponds to a width of one of the plurality of switching elements which the respective branch portions overlap therewith.

2. The cooling device according to claim 1,
wherein the first flow passage width of the first flow passage portion is a size that is equal to or larger than a width of the switching element in a flow passage width direction.

3. The cooling device according to claim 1,
wherein at least one plate-shaped heat transferring fin is provided in the first fluid passage portion and the second fluid passage portion of the refrigerant flow passage, respectively, and
the heat transferring fin in the second flow passage portion is configured with a fin having a smaller pressure loss than the heat transferring fin in the first flow passage portion.

4. The cooling device according to claim 3,
wherein the heat transferring fin in the second flow passage portion is a linear fin extending in a refrigerant circulation direction, and
the heat transferring fin in the first flow passage portion is an offset fin that is formed such that a plurality of fin portions arranged in the refrigerant circulation direction are shifted away from each other in a flow passage width direction.

5. The cooling device according to claim 3,
wherein the second flow passage portion is disposed upstream of the first flow passage portion in the refrigerant flow passage, and
the at least one fin in the second flow passage includes a plurality of heat transferring fins having different fin shapes or different pitches in a flow passage width direction are provided in the second flow passage portion such that the closer to the upstream side, the smaller a pressure loss.

6. The cooling device according to claim 1,
wherein the predetermined disposition region is the disposition region positioned on a most downstream side of the refrigerant flow passage, out of the plurality of disposition regions.

7. The cooling device according to claim 1,
wherein the predetermined disposition region is the disposition region where the power module including the switching element having a highest heat generation density is disposed, out of the plurality of disposition regions.

8. The cooling device according to claim 2,
wherein at least one plate-shaped heat transferring fin is provided in the first fluid passage portion and the second fluid passage portion of the refrigerant flow passage, respectively, and
the heat transferring fin in the second flow passage portion is configured with a fin having a smaller pressure loss than the heat transferring fin in the first flow passage portion.

9. The cooling device according to claim 8,
wherein the heat transferring fin in the second flow passage portion is a linear fin extending in a refrigerant circulation direction, and
the heat transferring fin in the first flow passage portion is an offset fin that is formed such that a plurality of fin portions arranged in the refrigerant circulation direction are shifted away from each other in a flow passage width direction.

10. The cooling device according to claim 4,
wherein the second flow passage portion is disposed upstream of the first flow passage portion in the refrigerant flow passage, and
the at least one fin in the second flow passage includes a plurality of heat transferring fins having different fin shapes or different pitches in a flow passage width direction are provided in the second flow passage portion such that the closer to the upstream side, the smaller a pressure loss.

* * * * *